US008790533B2

(12) United States Patent
Shin et al.

(10) Patent No.: US 8,790,533 B2
(45) Date of Patent: Jul. 29, 2014

(54) METHOD OF ETCHING SEMICONDUCTOR NANOCRYSTALS

(75) Inventors: Seung Koo Shin, Pohang-si (KR); Won Jung Kim, Seoul (KR); Sung Jun Lim, Pohang-si (KR)

(73) Assignee: Postech Academy-Industry Foundation, Pohang-si (KR)

( * ) Notice: Subject to any disclaimer, the term of this patent is extended or adjusted under 35 U.S.C. 154(b) by 313 days.

(21) Appl. No.: 12/979,845

(22) Filed: Dec. 28, 2010

(65) Prior Publication Data
US 2011/0263129 A1 Oct. 27, 2011

(30) Foreign Application Priority Data

Apr. 23, 2010 (KR) .................. 10-2010-0037984
Apr. 28, 2010 (KR) .................. 10-2010-0039697

(51) Int. Cl.
C03C 15/00 (2006.01)
C03C 25/68 (2006.01)

(52) U.S. Cl.
USPC .............................................. 216/87; 216/83

(58) Field of Classification Search
None
See application file for complete search history.

(56) References Cited

U.S. PATENT DOCUMENTS

| 5,242,468 | A | 9/1993 | Clark et al. ............. 29/25.01 |
| 5,869,398 | A | 2/1999 | Knight .......................... 438/689 |
| 5,888,906 | A | 3/1999 | Sandhu et al. ............... 438/706 |
| 2001/0046276 | A1* | 11/2001 | Schneider et al. ............. 378/58 |
| 2006/0281129 | A1* | 12/2006 | Iwao et al. ........................ 435/6 |
| 2007/0065665 | A1 | 3/2007 | Sato et al. ..................... 428/402 |
| 2009/0196828 | A1* | 8/2009 | Suijver .......................... 424/9.6 |
| 2009/0315446 | A1* | 12/2009 | Murase et al. ................ 313/483 |

FOREIGN PATENT DOCUMENTS

EP 1 491 502 A2 12/2004

OTHER PUBLICATIONS

Munro et al. "Quantitative Study of the Effects of Surface Ligand Concentration on CdSe Nanocrystal Photoluminescence" J. Phys. Chem. C 2007, 111, 6220-6227.*
Bortolus et al., "Photolysis of Polystyrene in Halocarbons. Evidence for the Involvement of a Charge-transfer Interaction in the Photochemical Degradation," Polymer Photochemistry 4:45-57, 1984.
Cao et al., "One-Pot Synthesis of High-Quality Zinc-Blende CdS Nanocrystals," J. Am. Chem. Soc. 126:14336-14337, 2004.
Chapman, "The Chlorine-Sensitized Photochemical Oxidation of Gaseous Chloroform," J. Am. Chem. Soc. 57:416-419, 1935.
Chen et al., "Spatially Selective Optical Tuning of Quantum Dot Thin Film Luminescence," J. Am. Chem. Soc. 131:18204-18205, 2009.
Galian et al., "Photochemical Size Reduction of CdSe/ZnS Semiconductor Nanoparticles Assisted by nπ* Aromatic Ketones," J. Am. Chem. Soc. 131:892-893, 2009.

(Continued)

Primary Examiner — Shamim Ahmed
Assistant Examiner — Bradford Gates
(74) Attorney, Agent, or Firm — Seed IP Law Group PLLC

(57) ABSTRACT

Disclosed is a method of etching semiconductor nanocrystals, which includes dissolving semiconductor nanocrystals in a halogenated solvent containing phosphine so that anisotropic etching of the surface of semiconductor nanocrystals is induced or adding a primary amine to a halogenated solvent containing phosphine and photoexciting semiconductor nanocrystals thus inducing isotropic etching of the surface of the nanocrystals, thereby reproducibly controlling properties of semiconductor nanocrystals including absorption wavelength, emission wavelength, emission intensity, average size, size distribution, shape, and surface state.

22 Claims, 12 Drawing Sheets

(56) References Cited

OTHER PUBLICATIONS

Geoffroy et al., "Photoinduced Oxidation of Tertiary Arylphosphines," *Inorganic Chemistry* 15(9):2310-2311, 1976.

Hines et al., "Colloidal PbS Nanocrystals with Size-Tunable Near-Infrared Emission: Observation of Post-Synthesis Self-Narrowing of the Particle Size Distribution," *Advanced Materials* 15(21):1844-1849, 2003.

Iwasaki et al., "Preparation and Characterization of Water-Soluble Jingle-Bell-Shaped Silica-Coated Cadmium Sulfide Nanoparticles," *J. Phys. Chem. B* 108:11946-11952, 2004.

Jones, II et al., "Solvent Effects on Emission Yield and Lifetime for Coumarin Laser Dyes. Requirements for a Rotatory Decay Mechanism," *J. Phys. Chem.* 89:294-300, 1985.

Kim et al., "Binary Amine-Phosphine Passivation of Surface Traps on CdSe Nanocrystals," *J. Phys. Chem. C* 114:1539-1546, 2010.

Li et al., "Amine-Assisted Facetted Etching of CdSe Nanocrystals," *J. Am. Chem. Soc.* 127:2524-2532, 2005.

Li et al., "Band-Edge Photoluminescence Recovery from Zinc-Blende CdSe Nanocrystals Synthesized at Room Temperature," *Advanced Functional Materials* 16:345-350, 2006.

Lim et al., "Synthesis and Characterization of Zinc-Blende CdSe-Based Core/Shell Nanocrystals and Their Luminescence in Water," *The Journal of Physical Chemistry Letters C* 112:1744-1747, 2008.

Liu et al., "Preparation of CdSe Quantum Dots with Full Color Emission Based on a Room Temperature Injection Technique," *Inorganic Chemistry* 47:5022-5028, 2008.

Liu et al., "The non-oxidative dissolution of galena nanocrystals: Insights into mineral dissolution rates as a function of grain size, shape, and aggregation state," *Geochimica et Cosmochimica Acta* 72:5984-5996, 2008.

Lorca et la., "An Efficient Amide-Forming Reaction Using Tributyltrichloro-Methylphosphonium Chloride," *Synthetic Communications* 31(4):469-473, 2001.

Matsumoto et al., "Preparation of Monodisperse CdS Nanocrystals by Size Selective Photocorrosion," *J. Phys. Chem.* 100:13781-13785, 1996.

Meulenkamp, "Size Dependence of the Dissolution of ZnO Nanoparticles," *J. Phys. Chem. B* 102:7764-7769, 1998.

Peng et al., "Mechanisms of the Shape Evolution of CdSe Nanocrystals," *J. Am. Chem. Soc.* 123:1389-1395, 2001.

Reiss et al., "Luminescent ZnSe nanocrystals of high color purity," *Materials Chemistry and Physics* 84:10-13, 2004.

Torimoto et al., "Characterization of Ultrasmall CdS Nanoparticles Prepared by the Size-Selective Photoetching Technique," *J. Phys. Chem. B* 105:6838-6845, 2001.

Torimoto et al., "Photochemical Fine-Tuning of Luminescent Color of Cadmium Selenide Nanoparticles: Fabricating a Single-Source Multicolor Luminophore," *The Journal of Physical Chemistry Letters B* 110:13314-13318, 2006.

Torimoto et al., "Photochemical Shape Control of Cadmium Sulfide Nanorods Coated with an Amorphous Silica Thin Layer," *Journal of Nanoscience and Nanotechnology* 9:506-513, 2009.

Uematsu et al., "Tuning of the fluorescence wavelength of CdTe quantum dots with 2 nm resolution by size-selective photoetching," *Nanotechnology* 20:215302, 2009. (9 pages).

van Dijken et al., "Size-Selective Photoetching of Nanocrystalline Semiconductor Particles," *Chem. Mater.* 10:3513-3522, 1998.

Yoon et al., "Novel fabrication of silica nanotube by selective photoetching of CdS nanorod template," *Materials Research Bulletin* 41:1657-1663, 2006.

Yu et al., "Experimental Determination of the Extinction Coefficient of CdTe, CdSe, and CdS Nanocrystals," *Chem. Mater.* 15:2854-2860, 2003.

Yu et al., "Formation and Stability of Size-, Shape-, and Structure-Controlled CdTe Nanocrystals: Ligand Effects on Monomers and Nanocrystals," *Chem. Mater.* 15:4300-4308, 2003.

\* cited by examiner (a) Zinc-blende CdSe nanosphere before and after etching in tributylphosphine/$CHCl_3$ solution under $O_2$ (b) Wurtzite CdSe nanorod before and after etching in tributylphosphine/$CHCl_3$ solution under $O_2$ (a) X-ray photoelectron spectrum of CdSe nanocrystals etched in tributylphosphine/CHCl$_3$ solution under O$_2$ (b) Laser desorption ionization-mass spectrum of CdSe nanocrystal tributylphosphine/CHCl$_3$ etching products Red : CdSe nanocrystals in chloroform solution under oxygen
 a : + triphenylphosphine
 b : + UV 254 nm / 2 min
 c : + propylamine (a) Zinc-blende CdSe nanosphere before and after photoetching by 254-nm UV in $CHCl_3$.

(b) Wurtzite CdSe nanorod before and after photoetching by 254-nm UV in $CHCl_3$.

METHOD OF ETCHING SEMICONDUCTOR NANOCRYSTALS

CROSS-REFERENCES TO RELATED APPLICATIONS

This application claims the benefit under 35 U.S.C. §119(e) of Korean Patent Application No. 10-2010-0039697, filed Apr. 28, 2010 and Korean Patent Application No. 10-2010-0037984, filed Apr. 23, 2010, where these (two) applications are incorporated herein by reference in their entireties.

BACKGROUND OF THE INVENTION

1. Technical Field

The present invention relates to a method of etching semiconductor nanocrystals, and more particularly to a method of etching semiconductor nanocrystals which includes dissolving semiconductor nanocrystals in a halogenated solvent containing phosphine to thus induce anisotropic etching of the surface of semiconductor nanocrystals or dissolving semiconductor nanocrystals in a halogenated solvent containing either a primary amine or a primary amine and phosphine and then photoexciting them to thus induce isotropic etching of the surface of the nanocrystals, thereby reproducibly controlling properties of semiconductor nanocrystals including absorption wavelength, emission wavelength, emission intensity, average size, size distribution, shape and surface state.

2. Description of the Related Art

Group II-VI, III-V or IV-VI compound semiconductor nanocrystals are peculiar materials whose optical and electrical properties vary depending on the size, shape and surface state of the particles due to a quantum confinement effect. In particular, semiconductor nanocrystals are advantageous because the band gap of a semiconductor may freely change within a wide energy range from UV light to IR light depending on the size and shape of the particles. Thanks to such advantages, semiconductor nanocrystals are receiving attention as a novel absorption/emission element in a variety of fields including biological labeling, LEDs, lasers, solar cells, and wireless communication. As such, the value of technology for reproducibly synthesizing semiconductor nanocrystals having a desired shape and controlling properties thereof is gradually increasing.

Typically semiconductor nanocrystals are manufactured using a colloidal growth method. The colloidal growth method is a process that induces the growth of semiconductor nanocrystals by reacting a metal precursor with a chalcogen precursor in an organic solvent such as tri-n-octylphosphine oxide or trioctylphosphine or a polar solvent such as water. In the course of growing semiconductor nanocrystals, depending on conditions including the type of solvent and ligand, the type and concentration of the precursor, and the temperature and time required to grow nanocrystals, semiconductor nanocrystals having various shapes such as a sphere, rod, bi-, tri-, or tetra-pod may be manufactured to a desired size.

However, when using only the colloidal growth method as described above, it is difficult to control the surface state of semiconductor nanocrystals, and thus the properties of semiconductor nanocrystals are difficult to reproduce and also limitations are imposed on changing the shape of semiconductor nanocrystals. For this reason, thorough research and development into a surface etching method which may be utilized together with the method of growing semiconductor nanocrystals in order to more precisely control the shape and properties of semiconductor nanocrystals is ongoing.

In the case of bulk semiconductors, surface etching methods using various halogen compounds such as hydrogen chloride or trichlorophosphine are disclosed (U.S. Pat. Nos. 5,242,468, 5,869,398, and 5,888,906). However, such surface etching methods are problematic because they use a gas-phase reaction and thus are difficult to apply to most semiconductor nanocrystals synthesized in a solution phase.

In order to etch semiconductor nanocrystals in a solution phase, the following methods have been proposed: 1) van Dijken and Torimoto et al. developed a photochemical etching method wherein various types of group II-VI or IV-VI compound semiconductor nanocrystals are photoexcited in an oxygen-containing aqueous solution thus inducing the oxidation of chalcogen (van Dijken et al., Chem. Mater. 10:3513 (1998), Torimoto et al., J. Phys. Chem. B105:6838 (2001), U.S. Ser. No. 07/006,5665 and EP 1 491 502); 2) Meulenkamp and Liu et al. studied the procedure of etching ZnO and PbS nanocrystals using acids such as acetic acid and hydrochloric acid in a polar solvent such as alcohol or water (Meulenkamp et al., J. Phys. Chem. B102:7764 (1998) and Liu et al., Geochim. Cosmochim. Ac. 72:5984 (2008)); 3) Li et al. introduced the etching of CdSe nanocrystals using oxygen and aminoalcohol in water (Li et al., J. Am. Chem. Soc. 127:2524 (2005) and Li et al., Adv. Funct. Mater. 16:345 (2006)]); 4) Yu and Liu et al. reported the etching of CdSe nanocrystals using a strong acid such as hydrochloric acid or a peroxide such as benzoyl peroxide or hydrogen peroxide in chloroform (Yu et al., Chem. Mater. 15:2854 (2003) and Liu et al., Inorg. Chem. 47:5022 (2008)); and 5) Galian et al. reported the photochemical etching of CdSe core and CdSe/ZnS core/shell nanocrystals using oxygen in toluene, aromatic ketone, and excitation light (Galian et al., J. Am. Chem. Soc. 131:892 (2009)).

However, the above methods of etching semiconductor nanocrystals in a solution phase mainly use an aqueous solution or a polar solvent such as alcohol and thus cannot be directly applied to most semiconductor nanocrystals synthesized in a non-aqueous organic solvent. Furthermore, the average etching procedure is a very slow reaction that takes place over the time span of from ones to tens of hours. Furthermore, the etching methods using strong acid, peroxide, or oxygen-aromatic ketone-excitation light in a non-aqueous solvent have a reproducibility of the reaction rate and thus cannot be utilized as an effective etching process.

Among such methods of etching semiconductor nanocrystals, the photochemical etching method in which the nanocrystals are photoexcited to thus induce the chemical etching reaction may induce size-selective etching because of the properties of semiconductor nanocrystals whose absorption wavelength varies depending on the particle size, and is thus regarded as effective for precisely controlling the properties of semiconductor nanocrystals.

Currently, the most advanced research into photoetching of semiconductor nanocrystals is being conducted by some researchers including Torimoto. They developed a photochemical etching method in which group II-VI or IV-VI compound semiconductor nanocrystals are photoexcited in an oxygen-containing aqueous solution or atmosphere thus inducing the oxidation of chalcogen (Matsumoto et al., J. Phys. Chem. 100:13781 (1996), van Dijken et al., Chem. Mater. 10:3513 (1998), Uematsu et al., Nanotechno. 20:215302 (2009), U.S. Ser. No. 07/006,5665 and EP 1 491 502). In addition, there was reported a photochemical etching method using monochromatic excitation light such as a laser to increase size-selectivity (Torimoto et al., J. Phys. Chem. B105:6838 (2001) and Torimoto et al., J. Phys. Chem. B110: 13314 (2006)). In addition, research results have been published in which complicated structures such as CdS nanorods, silica or organic polymer shell clad core/shell nanocrystals, and an array of two-dimensional nanocrystals are photoexcited (Torimoto et al., *J. Nanosci. Nanotechno.* 9:506 (2009), Iwasaki et al., *J. Phys. Chem. B* 108:11946 (2004), Yoon et al., *Mater. Res. Bull.* 41:1657 (2006) and Chen et al., *J. Am. Chem. Soc.* 131:18204 (2009)).

However, the above photoetching methods are problematic because they are based on oxidation by oxygen in an aqueous solution phase and thus cannot be directly applied to most semiconductor nanocrystals synthesized in a non-aqueous organic solvent, and also because the reaction is very slow, so slow in fact that high-output excitation light of about tens of mW should be applied for ones of hours or longer in order to cause a blue shift of about 10 nm (Torimoto et al., *J. Phys. Chem. B* 105:6838 (2001)). Also, in the case of CdS nanorods, because only anisotropic etching in which long nanorods are shortened during photoetching is possible, isotropic etching in which the size is reduced while the shape is maintained cannot be performed (Torimoto et al., *J. Nanosci. Nanotechno.* 9:506 (2009)).

Recently, Galian et al. published a photoetching method not in aqueous solution/oxygen conditions but in toluene/oxygen conditions, but the reaction was difficult to control and the reproducibility was low and thus this method is not regarded as effective (Galian et al., *J. Am. Chem. Soc.* 131:892 (2009)).

Taking into consideration the above problems, the present inventors have devised a method of effectively etching semiconductor nanocrystals synthesized in a non-aqueous solvent using any halogenated solvent such as dichloromethane, chloroform or tetrachloromethane, containing phosphine such as tributylphosphine or triphenylphosphine, or a primary amine such as propylamine, octylamine or oleylamine.

In this method, 1) halide ions which are a reaction product of phosphine and halogenated solvent function to induce a chemical etching reaction for removing metal ions from the surface of semiconductor nanocrystals, thereby rapidly and reproducibly controlling the shape and properties of semiconductor nanocrystals. Furthermore, the chemical etching reaction according to the present invention enables anisotropic etching which is performed at different rates depending on the surface facet of semiconductor nanocrystals, and thus may be usefully employed to control the shape and properties of semiconductor nanocrystals. In addition, 2) the halogenated solvent receives electrons from the photoexcited semiconductor nanocrystals thus producing halide ions and also induces a photoetching reaction for removing metal ions from the surface of semiconductor nanocrystals along with a primary amine, thereby rapidly and reproducibly controlling the shape and properties of semiconductor nanocrystals. Furthermore, the photoetching reaction according to the present invention enables isotropic etching in which the shape of anisotropic nanocrystals such as semiconductor nanorods is maintained and the size thereof is reduced, and thus may be utilized as a novel method of controlling the shape and properties of semiconductor nanocrystals.

SUMMARY OF THE INVENTION

Accordingly, the present invention has been made keeping in mind the problems encountered in the related art and the present invention is intended to provide a method of etching semiconductor nanocrystals, which includes dissolving semiconductor nanocrystals in a halogenated solvent containing phosphine to thus induce anisotropic etching of the surface of the semiconductor nanocrystals or dissolving semiconductor nanocrystals in a halogenated solvent containing either a primary amine or a primary amine and phosphine followed by photoexcitation to thus induce isotropic etching of the surface of the nanocrystals, thereby reproducibly controlling properties of semiconductor nanocrystals including absorption wavelength, emission wavelength, emission intensity, average size, size distribution, shape, and surface state.

An aspect of the present invention provides a method of etching semiconductor nanocrystals, including (1) dissolving phosphine in a halogenated solvent thus preparing a first solution and (2) adding semiconductor nanocrystals to the first solution thus inducing etching of the semiconductor nanocrystals.

Another aspect of the present invention provides a method of etching semiconductor nanocrystals, including (0) dissolving a primary amine in a halogenated solvent thus preparing a first solution, (1) adding phosphine to the first solution, (2) adding semiconductor nanocrystals to the first solution, and (3) irradiating the first solution with excitation light having a wavelength able to be absorbed by the semiconductor nanocrystals thus inducing etching of the semiconductor nanocrystals.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
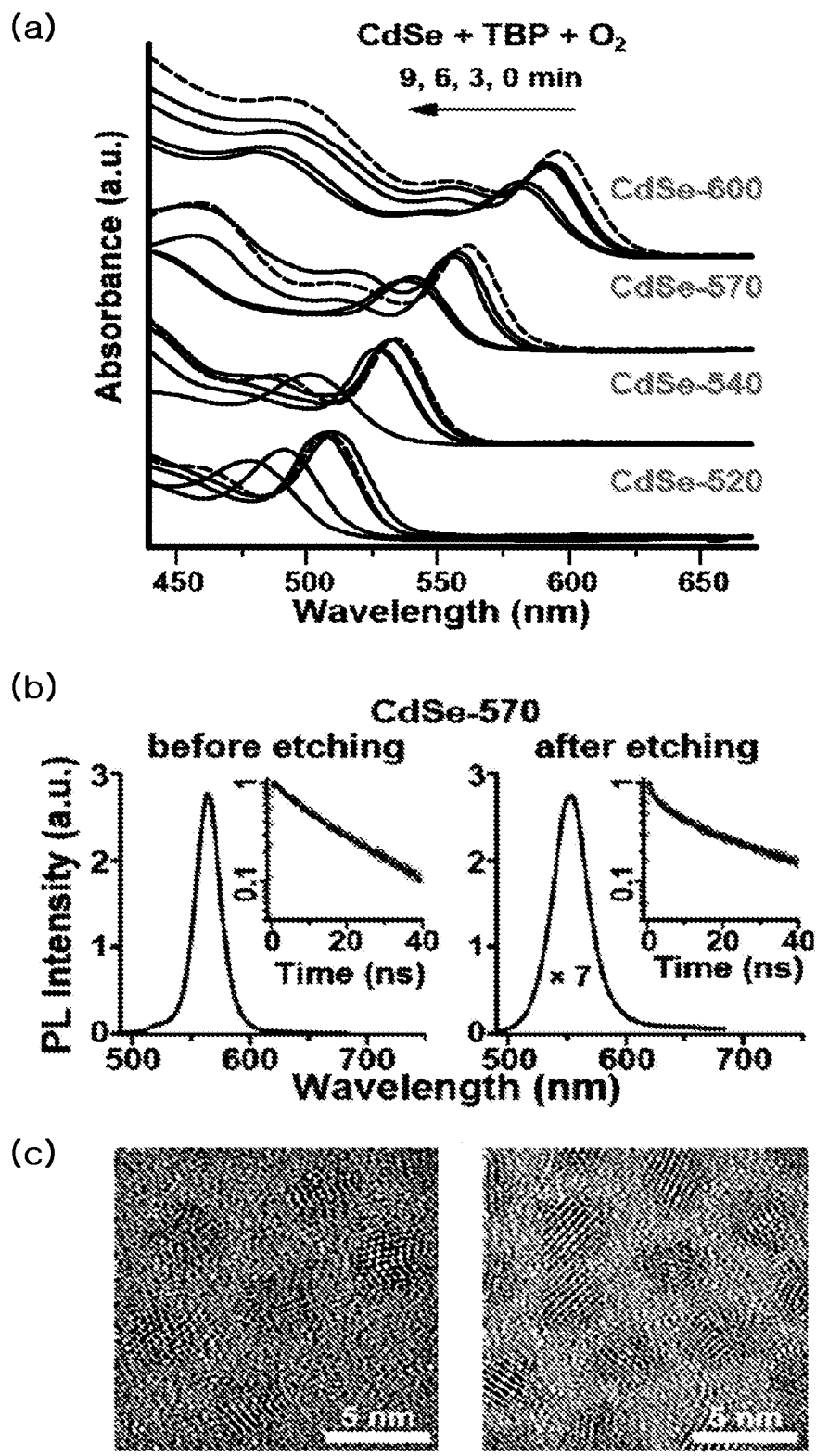
FIG. 1A is a graph showing changes in absorption spectrum of zinc blend CdSe nanocrystals having different sizes with respect to time which are chemically etched by exposing a chloroform solution containing the CdSe nanocrystals and tributylphosphine to high-purity oxygen at room temperature.
FIG. 1B is a graph showing the emission spectrum and time-resolved emission decay of zinc blend CdSe-570 nanocrystals before and after etching.
FIG. 1C is of high resolution transmission electron microscope(HRTEM) images showing changes in the average size of zinc blend CdSe-570 nanocrystals before and after etching.

Hereinafter, embodiments of the present invention will be described in detail while referring to the accompanying drawings.

The present invention is directed to a method of etching semiconductor nanocrystals including (1) dissolving phosphine in a halogenated solvent thus preparing a first solution and (2) adding semiconductor nanocrystals to the first solution thus inducing etching of the semiconductor nanocrystals.

Between (1) and (2), the method may further include (a) exposing the first solution to oxygen.

After (2), the method may further include (3) exposing the first solution including the semiconductor nanocrystals to oxygen, thus inducing etching of the semiconductor nanocrystals.

After (2), the method may further include (3) exposing the first solution including the semiconductor nanocrystals to oxygen and irradiating it with UV excitation light, thus inducing etching of the semiconductor nanocrystals.

Below, steps of the method according to the present invention are specified.

(1) Dissolving Phosphine in Halogenated Solvent Thus Preparing First Solution

Phosphine is added to the halogenated solvent thus preparing an etching solution of semiconductor nanocrystals. As such, phosphine may be added in an excess amount at least 10 times preferably about 10-500 times the total number of surface atoms of semiconductor nanocrystals to be etched.

In the present invention, the halogenated solvent is a material having a molecular structure containing a halogen element. Specifically, the halogenated solvent is selected from the group consisting of $C_1$-$C_{18}$ alkane, $C_2$-$C_{18}$ alkene, toluene, phenol and benzene, each of which is substituted with one or more halogens. Preferable examples of the halogenated solvent may include but are not limited to dichloromethane ($CH_2Cl_2$), chloroform ($CHCl_3$), tetrachloromethane ($CCl_4$), dibromomethane ($CH_2Br_2$), bromoform ($CHBr_3$), tetrabromomethane ($CBr_4$), diiodomethane ($CH_2I_2$), iodoform ($CHI_3$), tetraiodomethane ($CI_4$) and tetrachloroethylene ($C_2Cl_4$).

In the present invention, phosphine is a tertiary phosphine, and the carbon branch of the tertiary phosphine may be selected from among $C_3$-$C_{12}$ alkane, $C_3$-$C_{12}$ alkene, $C_3$-$C_{12}$ saturated aliphatic amine, $C_3$-$C_{12}$ unsaturated aliphatic amine, $C_3$-$C_{12}$ saturated aliphatic alcohol, $C_3$-$C_{12}$ unsaturated aliphatic alcohol, $C_3$-$C_{12}$ saturated fatty acid, $C_3$-$C_{12}$ unsaturated fatty acid, $C_3$-$C_{12}$ saturated aliphatic thiol, $C_3$-$C_{12}$ unsaturated aliphatic thiol, phenyl ($C_6H_6$), and benzyl ($C_6H_6CH_2$). In addition to tributylphosphine, various phosphines such as trioctylphosphine, triphenylphosphine and so on may be used. Also, the tertiary phosphine may be one or more selected from among tertiary phosphine oligomer and tertiary phosphine polymer.

(2) Adding Semiconductor Nanocrystals to the First Solution Thus Inducing Etching of the Semiconductor Nanocrystals Subsequently, the semiconductor nanocrystals are added to the halogenated solution containing phosphine, thus inducing chemical etching of the semiconductor nanocrystals. As such, the solution including the semiconductor nanocrystals may be exposed to oxygen and thus may induce the chemical etching of the semiconductor nanocrystals. Also, the solution including the semiconductor nanocrystals may be exposed to oxygen and irradiated with UV excitation light, thereby inducing chemical etching of the semiconductor nanocrystals. Also, the halogenated solution containing phosphine may be exposed to oxygen and thus oxidized, after which semiconductor nanocrystals are added thereto, thus inducing chemical etching of the semiconductor nanocrystals. Such chemical etching of the semiconductor nanocrystals is an anisotropic facet-selective etching.

In the present invention, the semiconductor nanocrystals include one or more selected from among group II-VI, III-V and IV-VI compound semiconductor nanocrystals. Preferably, 1) the group II-VI semiconductor nanocrystals are selected from among binary compounds including CdS, CdSe, CdTe, ZnS, ZnSe, ZnTe, and ZnO; trinary compounds, including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe; and quaternary compounds including CdZnSeS, CdZnSeTe, CdZnSTe, CdHgSeS, CdHgSeTe, CdHgSTe, HgZnSeS, HgZnSeTe, and HgZnSTe, 2) the group III-V semiconductor nanocrystals are selected from among binary compounds including GaN, GaP, GaAs, GaSb, InN, InP, InAs, and InSb; trinary compounds including GaNP, GaNAs, GaNSb, GaPAs, GaPSb, InNP, InNAs, InNSb, InPAs, InPSb, and GaAlNP; and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, 3) the group IV-VI semiconductor nanocrystals are selected from among binary compounds including SnS, SnSe, SnTe, PbS, PbSe, and PbTe; trinary compounds including SnSeS, SnSeTe, SnSTe, PbSeS, PbSeTe, PbSTe, SnPbS, SnPbSe, and SnPbTe; and quaternary compounds including SnPbSSe, SnPbSeTe, SnPbSTe. More preferably, the semiconductor nanocrystals are binary semiconductor nanocrystals such as CdS, CdSe, CdTe, ZnSe, and PbS.

Such semiconductor nanocrystals are synthesized to have a desired shape and absorption/emission wavelength using a solution-phase colloidal growth method or a gas-phase growth method such as molecular beam epitaxy and then purified. This method is known in the art and thus its specific description is omitted.

Also, it is noted that the semiconductor nanocrystals are a heterostructure comprising two or more types of different semiconductor materials. Such a heterostructure may include a junction structure, a core-shell structure, or a superlattice structure.

The oxidizing of the halogenated solution may be carried out using one or more methods selected from among exposure to a typical atmosphere, exposure to a high-purity oxygen atmosphere, exposure to a typical atmosphere during UV irradiation, and exposure to a high-purity oxygen atmosphere during UV irradiation.

As such, it is noted that the etching rate of the semiconductor nanocrystals be adjusted by one or more selected from among a concentration of semiconductor nanocrystals, a concentration of phosphine, a type of phosphine, a type of halogenated solvent, and oxidizing conditions.

After (2) or (3), the method may further include (4) purifying and separating the semiconductor nanocrystals etched to a desired level.

In order to check whether the semiconductor nanocrystals are etched to a desired level, the absorption spectrum of the solution of semiconductor nanocrystals is periodically measured thus evaluating the degree of etching of semiconductor nanocrystals.

In addition, the present invention pertains to a method of etching semiconductor nanocrystals including (0) dissolving a primary amine in a halogenated solvent thus preparing a first solution, (1) adding phosphine to the first solution, (2) adding semiconductor nanocrystals to the first solution, and (3) irradiating the first solution with excitation light having a wavelength able to be absorbed by the semiconductor nanocrystals thus inducing etching of the semiconductor nanocrystals.

Among the above steps, (1) and (2) are the same as those of the aforementioned method, with the exception of exposure to oxygen, and a specific description thereof is omitted, and the other steps are specified below.

After (0), (1) may be omitted and (2) may be performed.

(0) Adding Primary Amine to Halogenated Solvent

A primary amine is added to the halogenated solvent thus preparing an etching solution of semiconductor nanocrystals. As such, the primary amine may be added in an excess amount about 100-500 times the total number of surface atoms of the semiconductor nanocrystals which will be subsequently added. Depending on the composition of semiconductor nanocrystals, only the primary amine or both a primary amine and tertiary phosphine may be added.

Furthermore, the primary amine may be a $C_1$-$C_{18}$ saturated aliphatic amine or a $C_1$-$C_{18}$ unsaturated aliphatic amine, and various primary amines such as propylamine, octylamine, oleylamine and so on, or combinations of two or more types of different primary amines may be used.

Also, the primary amine may be one or more selected from among a $C_1$-$C_{18}$ alkane having a plurality of primary amine functional groups, a $C_2$-$C_{18}$ alkene having a plurality of primary amine functional groups, an oligomer having a primary amine functional group, and a polymer having a primary amine functional group.

(3) Irradiating the First Solution with Excitation Light Having a Wavelength Able to be Absorbed by Semiconductor Nanocrystals Thus Inducing Etching of the Semiconductor Nanocrystals The halogenated solution including the semiconductor nanocrystals and the primary amine or a primary amine and tertiary phosphine is irradiated with excitation light. As such, the halogenated solution may be stirred so that one or more of the semiconductor nanocrystals, primary amine and tertiary phosphine are uniformly mixed. When excitation light is irradiated thereon, photoetching of the semiconductor nanocrystals is carried out. As such, the photoetching of the semiconductor nanocrystals is isotropic etching.

Examples of a source of excitation light may include a continuous light such as a tungsten (W) lamp, a deuterium ($D_2$) lamp, a xenon (Xe) lamp, and a mercury (Hg) lamp, and monochromatic light such as a laser and a lamp light passed through a spectroscope. As such, it is noted that any light source capable of generating excitation light having a wavelength able to be absorbed by semiconductor nanocrystals may be utilized. In order to achieve precise size-selective photoetching, a monochromatic light source such as a wavelength-selective laser and a lamp light passed through a spectroscope may be used.

The wavelength of the excitation light may be shorter than the absorption edge of the semiconductor nanocrystals. This is because the semiconductor nanocrystals may be excited only by light having the above wavelength.

The etching rate of the semiconductor nanocrystals may be controlled by one or more selected from among a concentration of semiconductor nanocrystals, a concentration of primary amine, a concentration of tertiary phosphine, a wavelength of excitation light, and an irradiation power of excitation light.

After (0) to (3), the method may further include (4) stopping the irradiating of excitation light when the etching of the semiconductor nanocrystals is performed to a desired level, and purifying and separating the semiconductor nanocrystals.

In order to check whether the etching of the semiconductor nanocrystals is carried out to a desired level, the absorption spectrum of the solution of semiconductor nanocrystals is periodically measured during the irradiation of excitation light, thus evaluating the degree of etching of semiconductor nanocrystals.

The following examples are set forth to illustrate, but are not to be construed as limiting the present invention, and may provide a better understanding of the present invention.

EXAMPLE 1

Chemical Etching of CdSe Nanocrystals Using Tributylphosphine and Chloroform Under Oxygen As semiconductor nanocrystals, CdSe-570 nanocrystals (the number indicates the maximum emission wavelength) were used, and tributylphosphine and a chloroform solvent were used as tertiary phosphine and a halogenated solvent, respectively. Also, exposure to high-purity oxygen atmosphere was used as oxidizing conditions. For the CdSe-570 nanocrystals, CdSe-570 nanocrystals synthesized by any conventional growth method and purified were able to be used, and particularly useful as the nanocrystals synthesized by a colloidal growth method using a non-coordinating solvent and purified were zinc blend CdSe-570 nanospheres (Lim et al., *J. Phys. Chem. C* 112:1744 (2008)) and wurtzite CdSe-570 nanorods (Peng et al., *J. Am. Chem. Soc.* 123:1389 (2001)).

Specifically, 0.1-0.6 μl of the CdSe-570 nanocrystals purified after being synthesized by a colloidal growth method were dissolved in about 10 ml of a anhydrous chloroform solvent in a 25 ml flask filled with argon (Ar) at room temperature. Then, tributylphosphine was added in an amount of 500-900 μl which is about 10 times the total number of surface atoms of the nanocrystals, after which the resulting solution was allowed to stand for about 1-2.5 hours in an Ar atmosphere so that the semiconductor nanocrystals were substituted with tributylphosphine ligands.

Then, the Ar atmosphere was changed to a high-purity oxygen atmosphere, so that the solution was exposed to high-purity oxygen, after which the solution was vigorously stirred using a stirrer, thus inducing etching of the nanocrystals. During the reaction, namely, 0 min, 3 min, 6 min and 9 min after the solution was exposed to high-purity oxygen, the absorption spectrum of a portion of the solution was measured to check the etching progress. As such, it should be noted that the etching rate may be additionally adjusted depending on the concentration of the nanocrystals, the concentration of tertiary phosphine, or the like. 0 min, 3 min, 6 min and 9 min after the solution was exposed to high-purity oxygen, changes in absorption spectrum of the CdSe-570 nanocrystals are shown in FIG. 1A. When the nanocrystals were etched to a desired level, supply of oxygen was stopped, and the nanocrystals were separated and purified in such a manner that the reaction solution was washed several times with excess methanol and only the etched nanocrystals were precipitated in acetone.

The emission spectrum and emission decay curve before and after etching of the CdSe-570 nanocrystals thus chemically etched are shown in FIG. 1B, and the shape of the CdSe-570 nanocrystals before and after etching is shown in FIG. 1C using high-resolution transmission electron microscopy (HRTEM).

Figure 2:
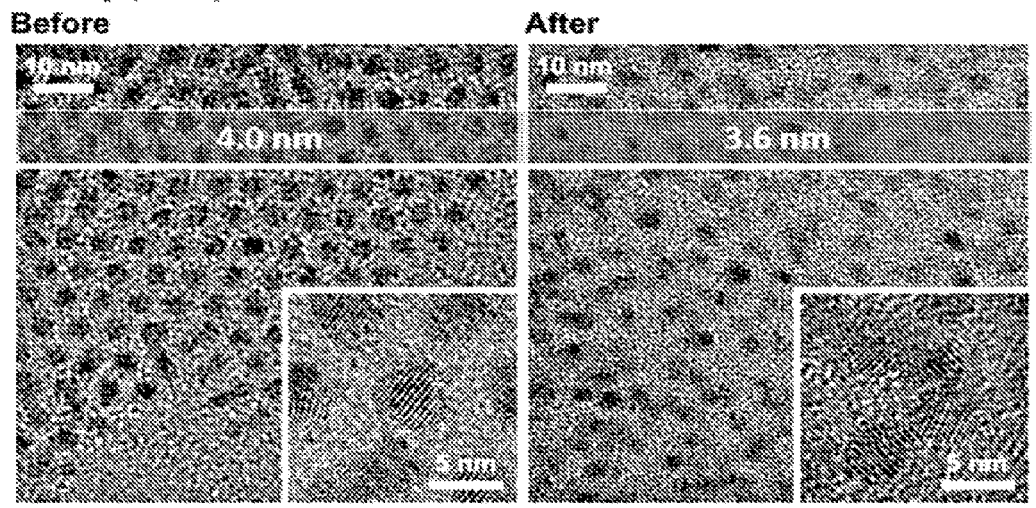
FIG. 2A is of TEM images showing zinc blend CdSe nanospheres before and after the chemical etching in Example 1.
FIG. 2B is of TEM images showing wurtzite CdSe nanorods before and after the chemical etching in Example 1.
Figure 2:
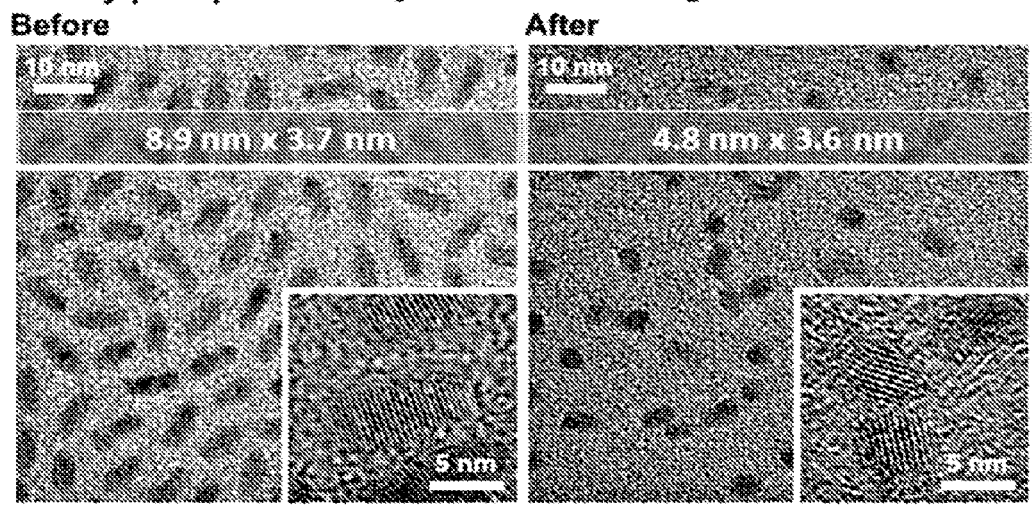

The transmission electron microscope (TEM) images of the zinc blend CdSe-570 nanospheres before and after etching and the TEM images of the wurtzite CdSe-570 nanorods before and after etching are shown in FIGS. 2A and 2B, respectively (chemical etching conditions: chloroform solvent, addition of tributylphosphine, exposure to high-purity oxygen atmosphere).

EXAMPLE 2

Chemical Etching of CdSe Nanocrystals Using Tributylphosphine and Chloroform Under Oxygen Atmosphere CdSe-520 nanocrystals were chemically etched in the same manner as in Example 1, with the exception that CdSe-520 nanocrystals were used as semiconductor nanocrystals instead of the CdSe-570 nanocrystals. During the reaction, the absorption spectrum of a portion of the solution was measured to check the etching progress. The results are shown in FIG. 1A.

EXAMPLE 3

Chemical Etching of CdSe Nanocrystals Using Tributylphosphine and Chloroform Under Oxygen Atmosphere CdSe-540 nanocrystals were chemically etched in the same manner as in Example 1, with the exception that CdSe-540 nanocrystals were used as semiconductor nanocrystals instead of the CdSe-570 nanocrystals. During the reaction, the absorption spectrum of a portion of the solution was measured to check the etching progress. The results are shown in FIG. 1A.

EXAMPLE 4

Chemical Etching of CdSe Nanocrystals Using Tributylphosphine and Chloroform Under Oxygen Atmosphere CdSe-600 nanocrystals were chemically etched in the same manner as in Example 1, with the exception that CdSe-600 nanocrystals were used as semiconductor nanocrystals instead of the CdSe-570 nanocrystals. During the reaction, the absorption spectrum of a portion of the solution was measured to check the etching progress. The results are shown in FIG. 1A.

EXAMPLE 5

CdSe-570 nanocrystals were chemically etched in the same manner as in Example 1. When the CdSe-570 nanocrystals were etched to a desired level, exposure to high-purity oxygen was stopped, and thereby the chemical etching was terminated.

After the termination of the chemical etching, the solution of CdSe-570 nanocrystals was added with about 40 ml of methanol and then centrifuged at about 5,000 rpm for 10 min thus separating the chemically etched CdSe-570 nanocrystals as a precipitate from the reaction product as a supernatant.

Also, the chemically etched CdSe-570 nanocrystals thus precipitated were dissolved again in a small amount of chloroform solvent thus preparing a solution. This solution was then dropped on Cu grids and dried, thereby manufacturing a test sample for TEM. This solution was also dropped on an Au-plated Si substrate and dried, thereby manufacturing a test sample for X-ray photoelectron spectroscopy. On the other hand, the supernatant was analyzed using laser desorption ionization mass spectroscopy.

Figure 3:
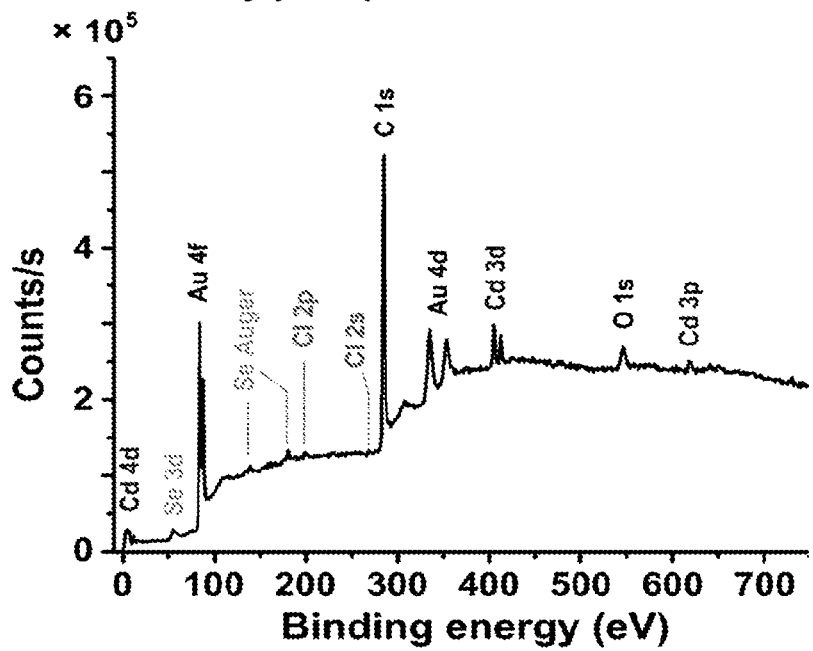
FIG. 3A is an X-ray photoelectron spectrum of a reaction product resulting from chemically etching CdSe-570 nanocrystals using tributylphosphine-chloroform-oxygen.
FIG. 3B is a mass spectrum of a reaction product resulting from chemically etching CdSe-570 nanocrystals using tributylphosphine-chloroform-oxygen.
Figure 3:
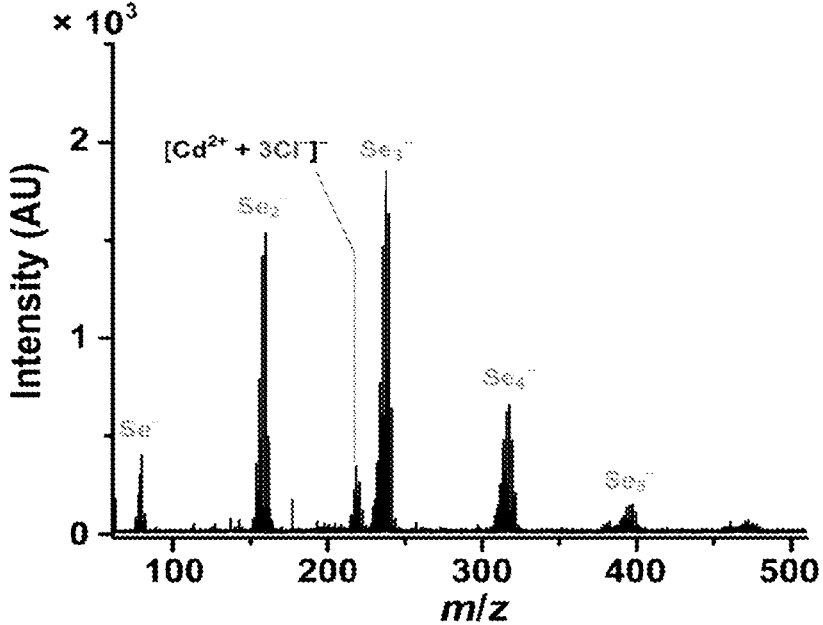

The results are shown in FIGS. 3A and 3B. FIG. 3A shows an X-ray photoelectron spectrum of the reaction product resulting from chemically etching the CdSe-570 nanocrystals using tributylphosphine-chloroform-oxygen. FIG. 3B shows a mass spectrum of the reaction product resulting from chemically etching the CdSe-570 nanocrystals using tributylphosphine-chloroform-oxygen.

EXAMPLE 6

Figure 4:
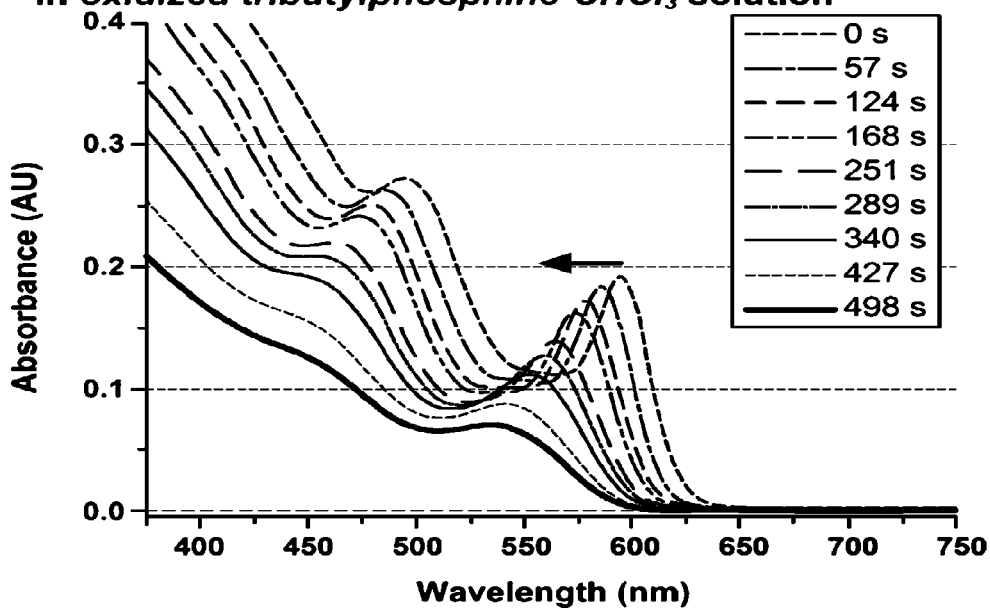
FIG. 4A shows changes in the absorption spectrum of zinc blend CdSe nanocrystals which are etched by being dissolved in an oxidized tributylphosphine-chloroform solution in Example 6.
FIG. 4B shows changes in the absorption spectrum of zinc blend CdSe nanocrystals which are etched by being dissolved in a tributylphosphine-tetrachloromethane solution in Example 7.
Figure 4:
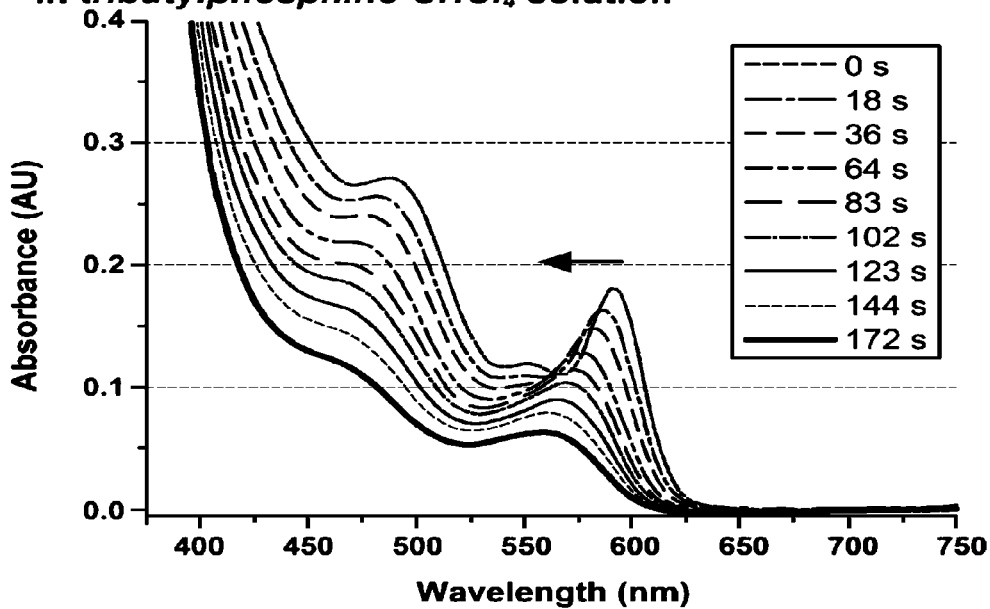

Chemical Etching of CdSe Nanocrystals Using Oxidized Tributylphosphine-Chloroform Solution CdSe-570 nanocrystals were etched in the same manner as in Example 1, with the exception that, before dissolving the CdSe-570 nanocrystals in a chloroform solvent, i) tributylphosphine was added to the chloroform solvent, ii) the tributylphosphine-chloroform solution was exposed to an oxygen atmosphere so as to be oxidized, and then iii) the CdSe-570 nanocrystals were dissolved. During the reaction, the absorption spectrum of a portion of the solution was measured to check the etching progress. The results are shown in FIG. 4A.

EXAMPLE 7

Chemical Etching of CdSe Nanocrystals Using Tributylphosphine-Tetrachloromethane Solution CdSe-570 nanocrystals were etched in the same manner as in Example 1, with the exception that i) a tetrachloromethane solvent was used instead of the chloroform solvent, and ii) the solution was allowed to react without exposure to oxygen. During the reaction, the absorption spectrum of a portion of the solution was measured to check the etching progress. The results are shown in FIG. 4B.

EXAMPLE 8

Chemical Etching of CdSe Nanocrystals Using Triphenylphosphine and Chloroform Under UV Irradiation and Oxygen CdSe-570 nanocrystals were etched in the same manner as in Example 1, with the exception that i) triphenylphosphine was used as the tertiary phosphine instead of tributylphosphine, and ii) in order to induce chemical etching the solution was exposed to high-purity oxygen and also irradiated with UV excitation light at a wavelength of 254 nm.

Figure 5:
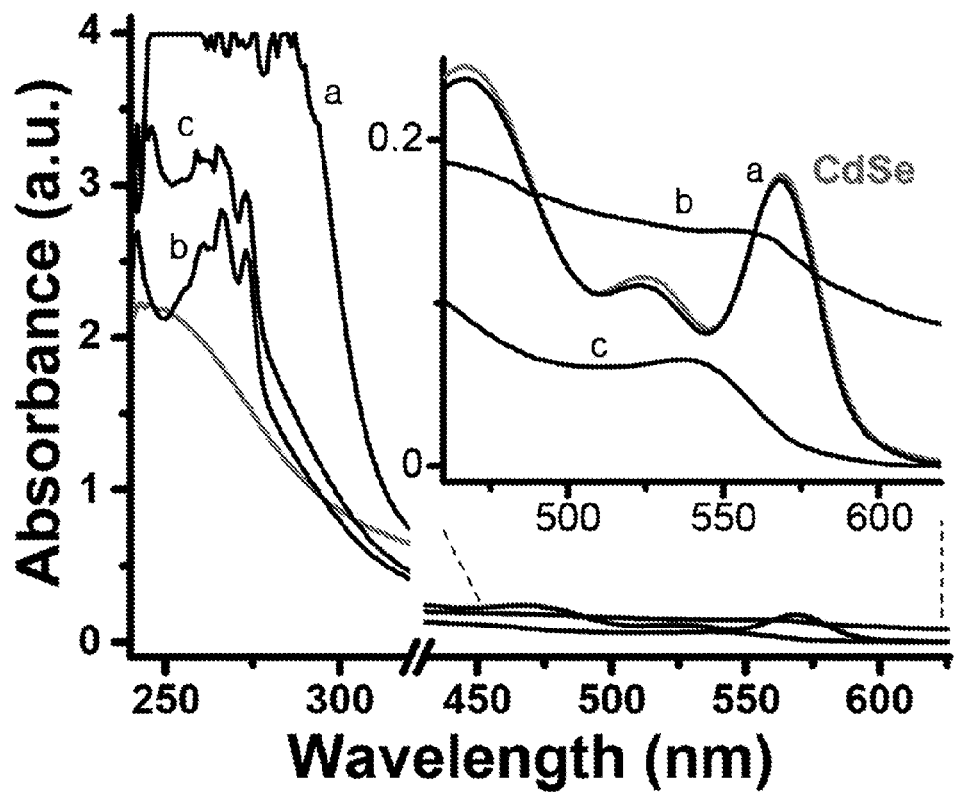
FIG. 5 is a graph showing changes in the absorption spectrum of zinc blend CdSe nanocrystals which are etched by irradiating a chloroform solution containing the CdSe nanocrystals and triphenylphosphine with UV light at 254 nm under an oxygen atmosphere in Example 8.

More specifically, 1) the absorption spectrum was measured when the chloroform solution including the dissolved CdSe-570 nanocrystals was exposed to oxygen, 2) the absorption spectrum was measured when about 10 equivalents of triphenylphosphine was added to the solution, 3) the absorption spectrum was measured when the solution including triphenylphosphine was exposed to UV excitation light at a wavelength of about 254 nm, and 4) the absorption spectrum was measured when about 20-100 µl of excess propylamine was added. When the absorption spectrum was measured in this way, the degree of etching of the CdSe nanocrystals could be checked. The results are shown in FIG. 5.

EXAMPLE 9

Chemical Etching of CdS Nanocrystals Using Tributylphosphine and Chloroform Under Oxygen Atmosphere As semiconductor nanocrystals, CdS nanocrystals were used, and tributylphosphine and a chloroform solvent were used as the tertiary phosphine and the halogenated solvent, respectively. Also, exposure to high-purity oxygen atmosphere was used as the oxidizing conditions. For the CdS nanocrystals, CdS nanocrystals synthesized by any conventional growth method and purified were able to be used, and particularly useful were zinc blend CdS nanospheres synthesized by a colloidal growth method using a non-coordinating solvent and purified (Cao et al., *J. Am. Chem. Soc.* 126:14336 (2004)).

Figure 6:
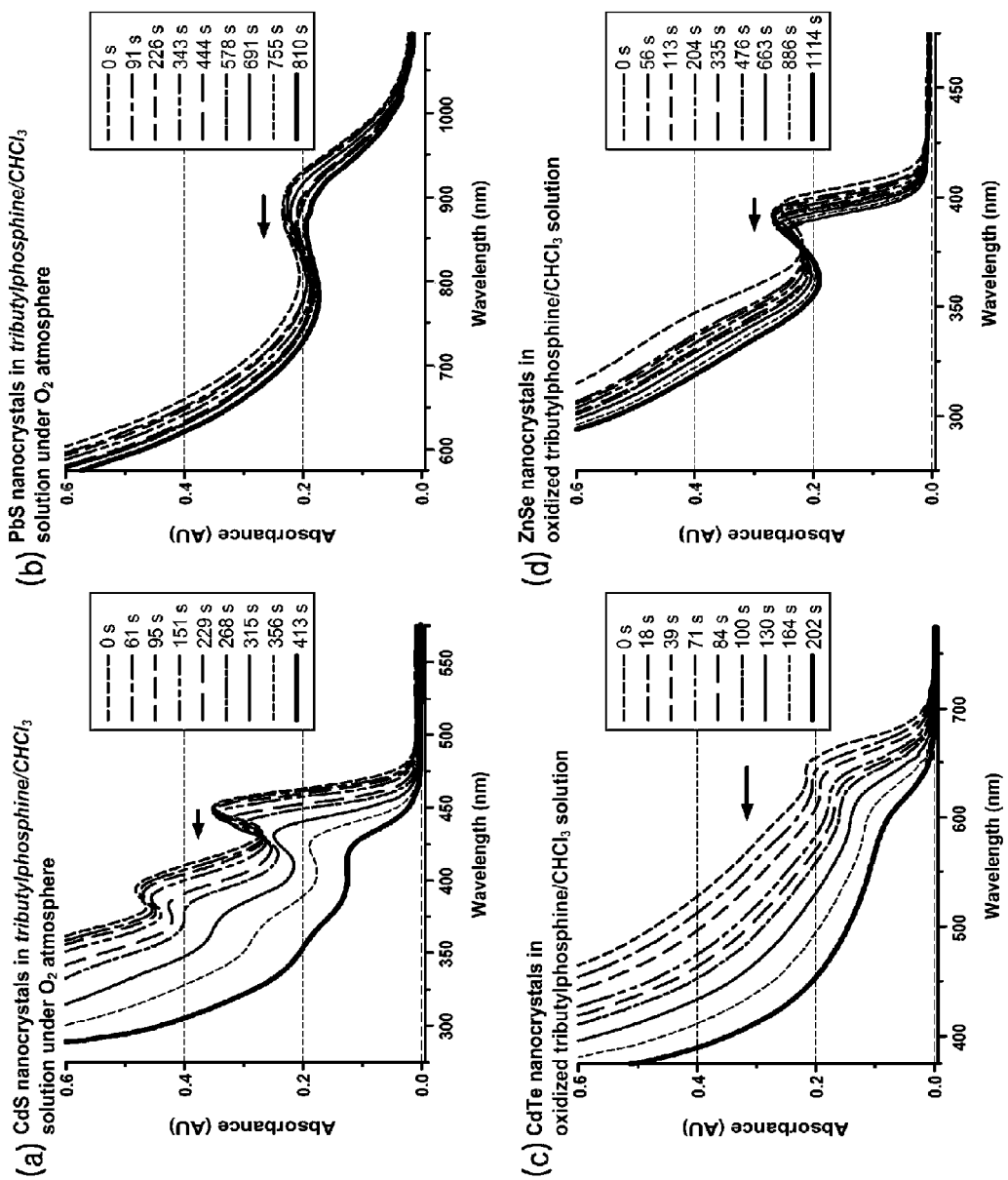
FIG. 6A is a graph showing changes in the absorption spectrum of CdS nanocrystals with respect to time in Example 9.
FIG. 6B is a graph showing changes in the absorption spectrum of PbS nanocrystals with respect to time in Example 10.
FIG. 6C is a graph showing changes in the absorption spectrum of CdTe nanocrystals with respect to time in Example 11.
FIG. 6D is a graph showing changes in the absorption spectrum of ZnSe nanocrystals with respect to time in Example 12.

Such CdS nanocrystals were etched in the same manner as in Example 1, with the exception that CdS nanocrystals were used instead of the CdSe nanocrystals. During the reaction, the absorption spectrum of a portion of the solution was measured to check the etching progress. The results are shown in FIG. 6A.

EXAMPLE 10

Chemical Etching of PbS Nanocrystals Using Tributylphosphine and Chloroform Under Oxygen Atmosphere As semiconductor nanocrystals, PbS nanocrystals were used, and tributylphosphine and a chloroform solvent were used as tertiary phosphine and a halogenated solvent, respectively. Also, exposure to high-purity oxygen atmosphere was used as oxidizing conditions. For the PbS nanocrystals, PbS nanocrystals synthesized by any conventional growth method and purified were able to be used, and particularly useful were PbS nanocrystals synthesized by a colloidal growth method using a non-coordinating solvent and purified (Hines et al., *Adv. Mater.* 15:1844 (2003)).

Such PbS nanocrystals were etched in the same manner as in Example 1, with the exception that PbS nanocrystals were used instead of the CdSe nanocrystals. During the reaction, the absorption spectrum of a portion of the solution was measured to check the etching progress. The results are shown in FIG. 6B.

EXAMPLE 11

Chemical Etching of CdTe Nanocrystals Using Oxidized Tributylphosphine-Chloroform Solution As semiconductor nanocrystals, CdTe nanocrystals were used, and tributylphosphine and a chloroform solvent were used as the tertiary phosphine and the halogenated solvent, respectively. For the CdTe nanocrystals, CdTe nanocrystals synthesized using any conventional growth method and purified were able to be used, and particularly useful were CdTe nanocrystals synthesized by a colloidal growth method using a non-coordinating solvent and purified (Yu et al., *Chem. Mater.* 15:4300 (2003)).

Such CdTe nanocrystals were etched in the same manner as in Example 6, with the exception that CdTe nanocrystals were used instead of the CdSe nanocrystals. During the reaction, the absorption spectrum of a portion of the solution was measured to check the etching progress. The results are shown in FIG. 6C.

EXAMPLE 12

Chemical Etching of ZnSe Nanocrystals Using Oxidized Tributylphosphine-Chloroform Solution As semiconductor nanocrystals, ZnSe nanocrystals were used, and tributylphosphine and a chloroform solvent were used as the tertiary phosphine and the halogenated solvent, respectively. For the ZnSe nanocrystals, ZnSe nanocrystals synthesized using any conventional growth method and purified were able to be used, and particularly useful were ZnSe nanocrystals synthesized by a colloidal growth method using a non-coordinating solvent and purified (Reiss et al., *Mater. Chem. Phys.* 84:10 (2004)).

Such ZnSe nanocrystals were etched in the same manner as in Example 6, with the exception that ZnSe nanocrystals were used instead of the CdSe nanocrystals. During the reaction, the absorption spectrum of a portion of the solution was measured to check the etching progress. The results are shown in FIG. 6D.

EXAMPLE 13

Photoetching of CdSe Nanocrystals Using Chloroform Solvent and UV Excitation Light As semiconductor nanocrystals, CdSe nanocrystals were used, and a chloroform solvent and propylamine were used as the halogenated solvent and the primary amine, respectively. For the CdSe nanocrystals, CdSe nanocrystals synthesized using any conventional growth method and purified were able to be used, and particularly useful as the nanocrystals synthesized by a colloidal growth method using a non-coordinating solvent and purified were zinc blend CdSe nanospheres (Lim et al., *J. Phys. Chem. C* 112:1744 (2008)) and wurtzite CdSe nanorods (Peng et al., *J. Am. Chem. Soc.* 123:1389 (2001)).

Specifically, the CdSe nanocrystals synthesized using a colloidal growth method and purified were dissolved in about 3 ml of a anhydrous chloroform solvent in a 4 ml quartz cell. Then, propylamine was added thereto, and the quartz cell was filled with Ar and sealed. Furthermore, the quartz cell was further provided with stirring bars, so that the components were uniformly mixed. As such, the band-edge absorbance of the CdSe nanocrystals was adjusted to about 0.4, and the amount of propylamine was adjusted to about 50 μl corresponding to an excess amount about hundreds of times the total number of surface atoms of the CdSe nanocrystals in the solution.

Figure 7:
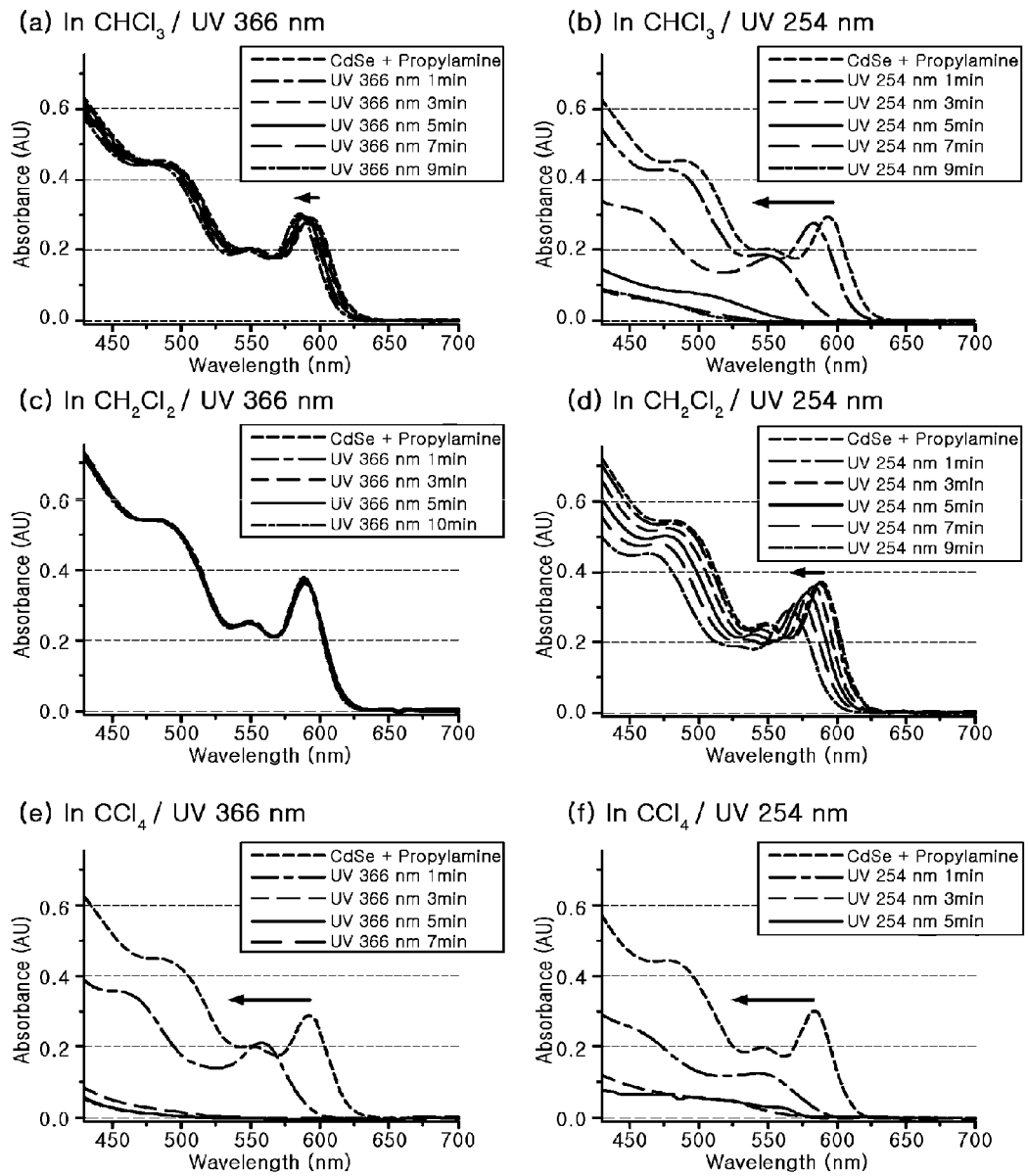
FIGS. 7A and 7B are graphs showing changes in the absorption spectrum of zinc blend CdSe nanocrystals which are etched by UV excitation light at 366 nm and 254 nm respectively in Example 13.
FIGS. 7C and 7D are graphs showing changes in the absorption spectrum of zinc blend CdSe nanocrystals which are etched by UV excitation light at 366 nm and 254 nm respectively in Comparative Example 1.
FIGS. 7E and 7F are graphs showing changes in the absorption spectrum of zinc blend CdSe nanocrystals which are etched by UV excitation light at 366 nm and 254 nm respectively in Comparative Example 2.

After 30 min, the solution was stirred by means of a stirrer and irradiated with UV light at 366 nm and 254 nm using a portable UV lamp (3-4 W). The absorption spectrum of a portion of the solution was measured at intervals of 1 min during the reaction, so that the etching progress could be checked. The changes in the absorption spectrum of the CdSe nanocrystals with respect to time are shown in FIGS. 7A and 7B.

Figure 8:
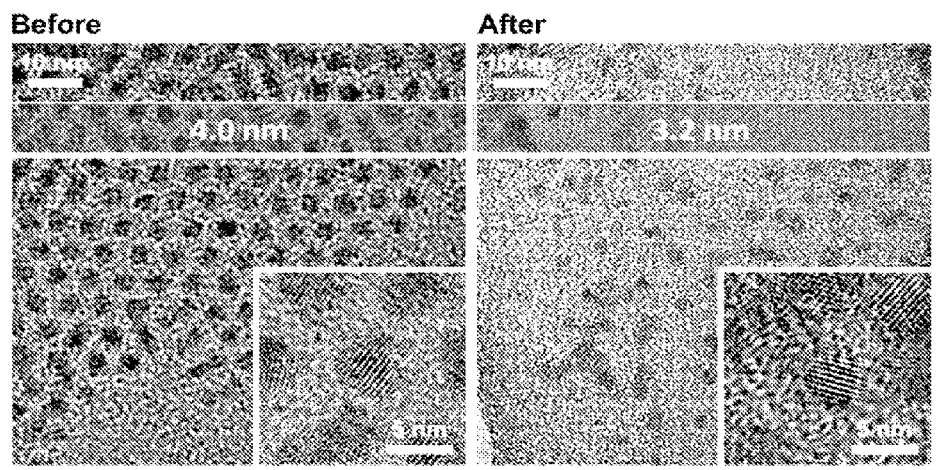
FIG. 8A is of TEM images showing zinc blend CdSe nanospheres before and after photoetching using UV light at 254 nm in Example 13.
FIG. 8B is of TEM images showing wurtzite CdSe nanorods before and after photoetching using UV light at 254 nm in Example 13.
Figure 8:
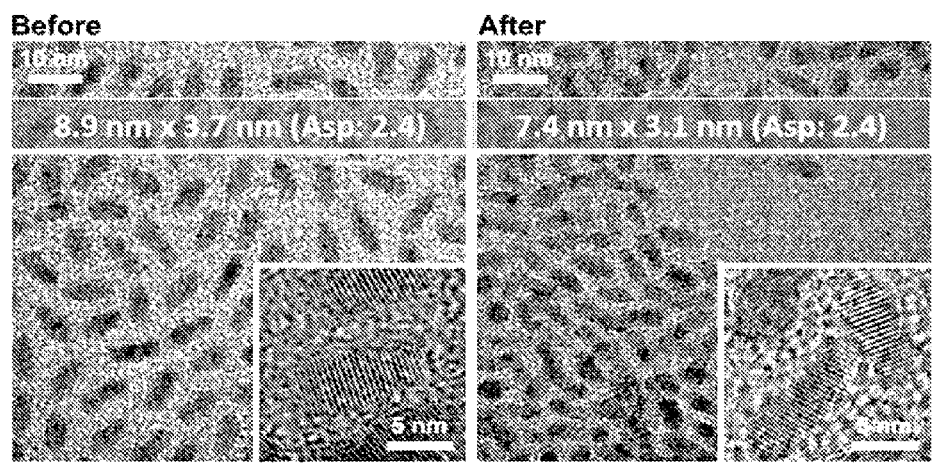

The TEM images of the zinc blend CdSe nanospheres before and after photoetching and the TEM images of the wurtzite CdSe nanorods before and after photoetching are shown in FIGS. 8A and 8B respectively (photoetching conditions: chloroform solvent, addition of propylamine, application of UV light at 254 nm).

Comparative Example 1

Photoetching of CdSe Nanocrystals Using Dichloromethane Solvent and UV Excitation Light CdSe nanocrystals were etched in the same manner as in Example 13, with the exception that dichloromethane was used instead of the chloroform solvent. The absorption spectrum of a portion of the solution during the reaction was measured to check the etching progress. The results are shown in FIGS. 7C and 7D.

Comparative Example 2

Photoetching of CdSe Nanocrystals Using Tetrachloromethane Solvent and UV Excitation Light CdSe nanocrystals were etched in the same manner as in Example 13, with the exception that tetrachloromethane was used instead of the chloroform solvent. The absorption spectrum of a portion of the solution during the reaction was measured to check the etching progress. The results are shown in FIGS. 7E and 7F.

EXAMPLE 14

CdSe nanocrystals were etched in the same manner as in Example 13, with the exception that dodecylamine was used instead of propylamine. When the CdSe nanocrystals were etched to a desired level, the irradiation of UV excitation light (254 nm) was stopped and thereby photoetching was terminated.

After the termination of photoetching, the solution of CdSe nanocrystals was added with about 20 ml of methanol. The solution was centrifuged at about 10,000 rpm for 10 min, thus separating the photoetched CdSe nanocrystals as a precipitate from the reaction product as a supernatant.

Subsequently, the photoetched CdSe semiconductor nanocrystals thus precipitated were dissolved again in a small amount of chloroform solvent thus preparing a solution, after which this solution was then dropped on Cu grids and dried, thereby manufacturing a test sample for TEM. This solution was also dropped on an Au-plated Si substrate and dried, thereby manufacturing a test sample for X-ray photoelectron spectroscopy. The supernatant was analyzed using laser desorption ionization mass spectroscopy.

Figure 9:
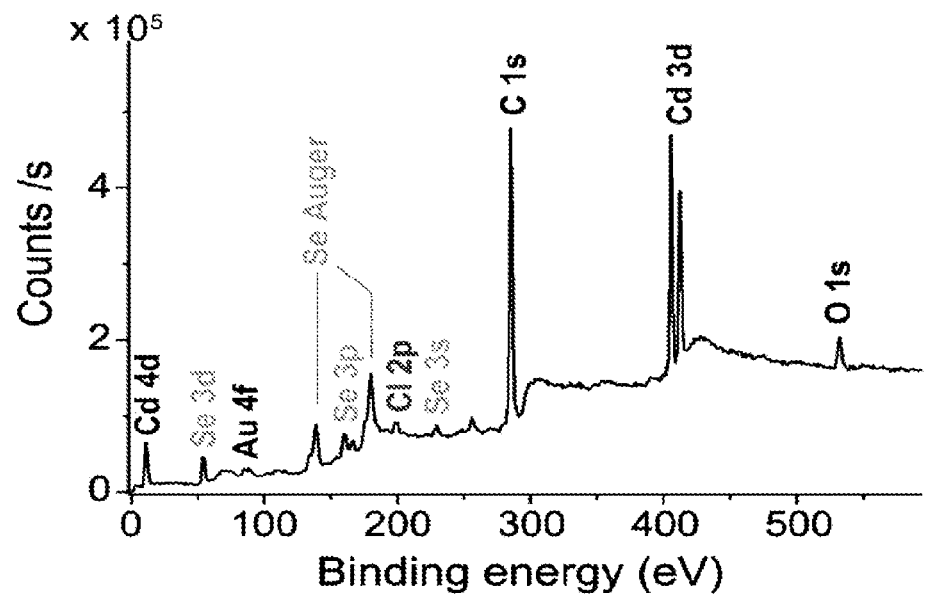
FIG. 9A is the X-ray photoelectron spectrum of a reaction product resulting from photoetching CdSe nanocrystals using dodecylamine (using UV light at 254 nm)
FIG. 9B is mass spectrum of a reaction product resulting from photoetching CdSe nanocrystals using dodecylamine (using UV light at 254 nm)
Figure 9:
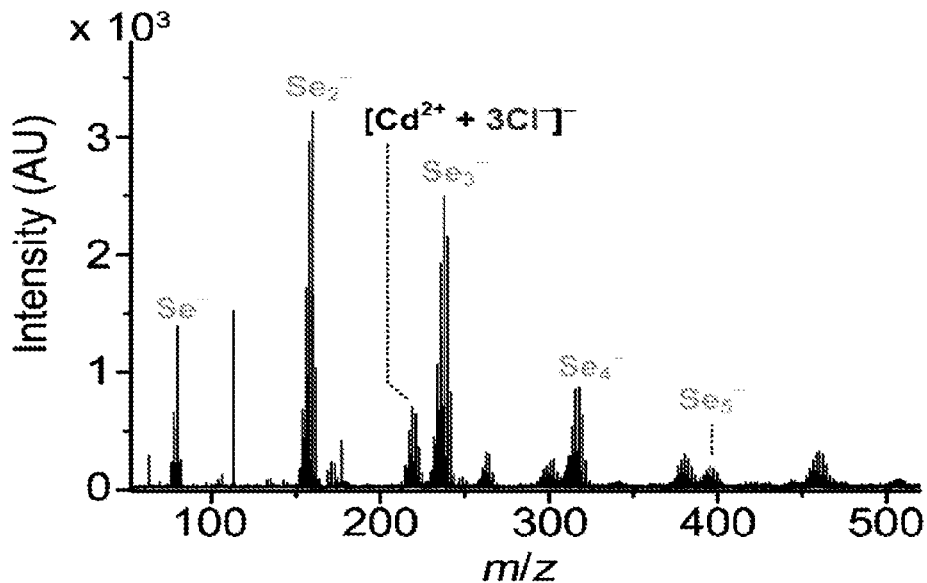

The results are shown in FIGS. 9A and 9B. FIG. 9A shows an X-ray photoelectron spectrum of the reaction product resulting from photoetching the CdSe nanocrystals using dodecylamine. FIG. 9B shows a mass spectrum of the reaction product resulting from photoetching the CdSe nanocrystals using dodecylamine

EXAMPLE 15

Photoetching of CdS Nanocrystals Using Chloroform Solvent and UV Excitation Light As semiconductor nanocrystals, CdS nanocrystals were used, and a chloroform solvent and octylamine were used as the halogenated solvent and the primary amine, respectively. For the CdS nanocrystals, CdS nanocrystals synthesized using any conventional growth method and purified were able to be used, and particularly useful were zinc blend CdS nanospheres synthesized by a colloidal growth method using a non-coordinating solvent and purified (Cao et al., *J. Am. Chem. Soc.* 126:14336 (2004)).

Specifically, the CdS nanocrystals synthesized using a colloidal growth method and purified were dissolved in about 3 ml of a anhydrous chloroform solvent in a 4 ml quartz cell. Then, octylamine was added thereto, and the quartz cell was filled with Ar and sealed. Furthermore, the quartz cell was provided with stirring bars so that the components were uniformly mixed. As such, the band-edge absorbance of the CdS nanocrystals was adjusted to about 0.4, and the amount of octylamine was adjusted to about 50 μl corresponding to an excess amount about hundreds of times the total number of surface atoms of the CdS nanocrystals in the solution.

Figure 10:
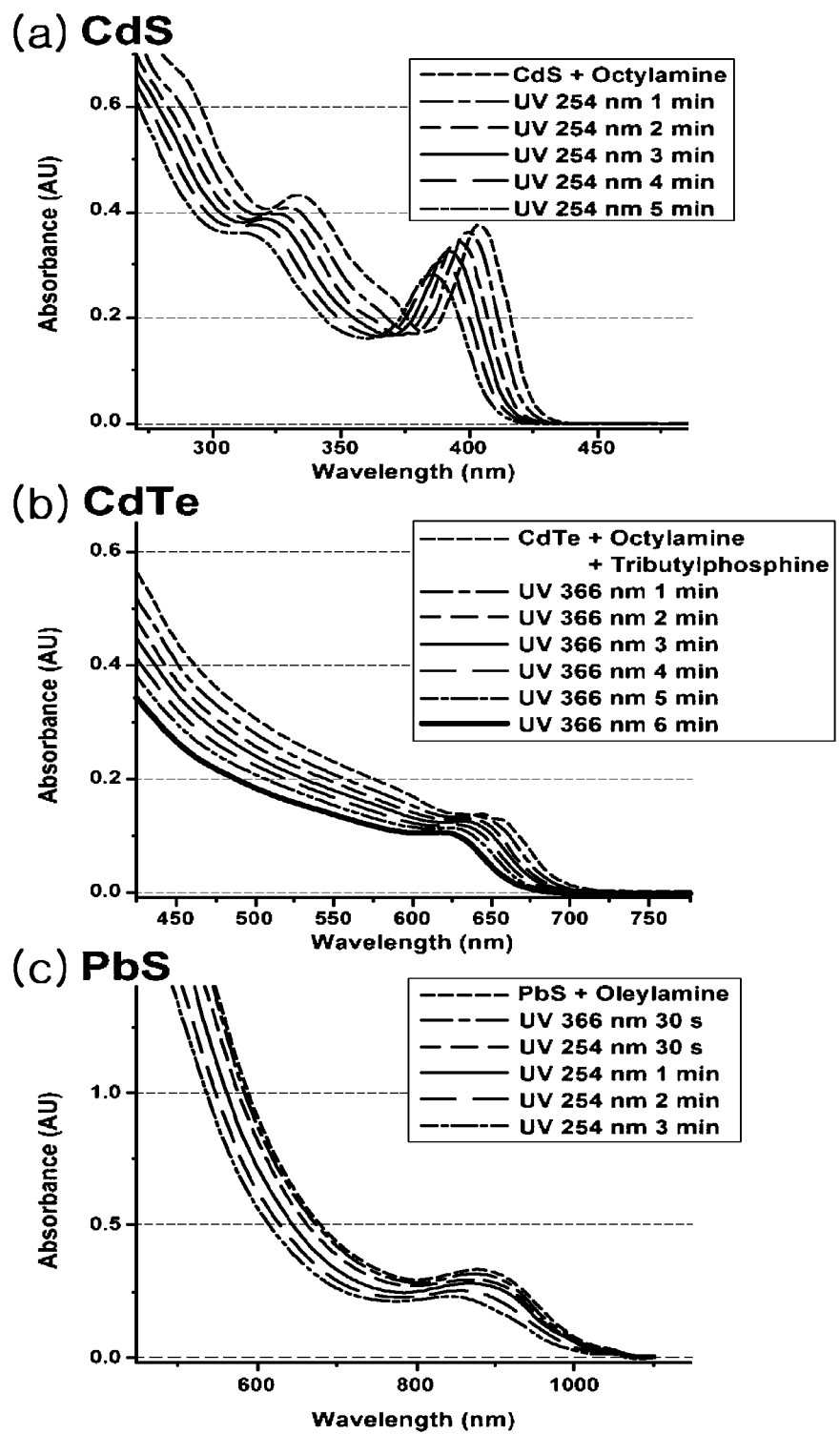
FIG. 10A is a graph showing changes in the absorption spectrum of CdS nanocrystals with respect to time in Example 15.
FIG. 10B is a graph showing changes in the absorption spectrum of CdTe nanocrystals with respect to time in Example 16.
FIG. 10C is a graph showing changes in the absorption spectrum of PbS nanocrystals with respect to time in Example 17.

After 30 min, the solution was stirred by means of a stirrer and irradiated with UV light at 366 nm using a portable UV lamp (3-4 W). The absorption spectrum of a portion of the solution was measured at intervals of 1 min during the reaction, so that the etching progress could be checked. The changes in absorption spectrum of the CdS nanocrystals with respect to time are shown in FIG. 10A.

EXAMPLE 16

Photoetching of CdTe Nanocrystals Using Chloroform Solvent and UV Excitation Light As semiconductor nanocrystals, CdTe nanocrystals were used, and chloroform was used as a halogenated solvent, and octylamine and tributylphosphine were used as the primary amine and the tertiary phosphine, respectively. For the CdTe nanocrystals, CdTe nanocrystals synthesized using any conventional growth method and purified were able to be used, and particularly useful were CdTe nanocrystals synthesized by a colloidal growth method using a non-coordinating solvent and purified (Yu et al., *Chem. Mater.* 15:4300 (2003)).

Specifically, the CdTe nanocrystals synthesized using a colloidal growth method and purified were dissolved in about 3 ml of a anhydrous chloroform solvent in a 4 ml quartz cell. Then, octylamine and tributylphosphine were added together thereto, and the quartz cell was filled with Ar and sealed. Furthermore, the quartz cell was provided with stirring bars so that the components were uniformly mixed. As such, the band-edge absorbance of the CdTe nanocrystals was adjusted to about 0.1, and the amounts of octylamine and tributylphosphine were adjusted to about 50 μl corresponding to an excess amount from about tens to about hundreds of times the total number of surface atoms of the CdTe nanocrystals in the solution.

After 30 min, the solution was stirred by means of a stirrer and irradiated with UV light at 366 nm using a portable UV lamp (3-4 W). The absorption spectrum of a portion of the solution was measured at intervals of 1 min during the reaction, so that the etching progress could be checked. The changes in the absorption spectrum of the CdTe nanocrystals with respect to time are shown in FIG. 10B.

EXAMPLE 17

Photoetching of PBS Nanocrystals Using Chloroform Solvent and UV Excitation Light As semiconductor nanocrystals, PbS nanocrystals were used, and a chloroform solvent and octylamine were used as the halogenated solvent and the primary amine, respectively. For the PbS nanocrystals, PbS nanocrystals synthesized using any conventional growth method and purified were able to be used, and particularly useful were PbS nanocrystals synthesized by a colloidal growth method using a non-coordinating solvent and purified (Hines et al., *Adv. Mater.* 15:1844 (2003)).

Specifically, the PbS nanocrystals synthesized using a colloidal growth method and purified were dissolved in about 3 ml of a anhydrous chloroform solvent in a 4 ml quartz cell. Then, octylamine was added thereto, and the quartz cell was filled with Ar and sealed. Furthermore, the quartz cell was provided with stirring bars so that the components were uniformly mixed. As such, the band-edge absorbance of the PbS nanocrystals was adjusted to about 0.25, and the amount of octylamine was adjusted to about 50 μl corresponding to an excess amount of about hundreds of times the total number of surface atoms of the PbS nanocrystals in the solution.

After 30 min, the solution was stirred by means of a stirrer and irradiated with UV light at 366 nm and 254 nm using a portable UV lamp (3-4 W). The absorption spectrum of a portion of the solution was measured at intervals of 30 sec or 1 min during the reaction, so that the etching progress could be checked. The changes in the absorption spectrum of the PbS nanocrystals with respect to time are shown in FIG. 10C.

EXAMPLE 18

Size-Selective Photoetching of CdSe Nanocrystals Using Chloroform Solvent and Monochromatic Excitation Light and Binary Surface Passivation As semiconductor nanocrystals, CdSe nanocrystals were used, and a chloroform solvent and octylamine were used as a halogenated solvent and primary amine, respectively. For the CdSe nanocrystals, CdSe nanocrystals synthesized using any conventional growth method and purified were able to be used, and particularly useful were zinc blend CdSe nanospheres synthesized by a colloidal growth method using a non-coordinating solvent and purified (Lim et al., *J. Phys. Chem. C* 112:1744 (2008)).

Specifically, the CdSe nanocrystals (fluorescence wavelength: about 600 nm) synthesized using a colloidal growth method and purified were dissolved in about 3 ml of a anhydrous chloroform solvent in a 4 ml quartz cell. Then, octylamine was added thereto, and the quartz cell was filled with Ar and sealed. Furthermore, the quartz cell was provided with stirring bars so that the components were uniformly mixed. As such, the band-edge absorbance of the CdSe nanocrystals was adjusted to about 2, and the amount of octylamine was adjusted to about 200 μl corresponding to an excess amount the total number of surface atoms of the CdSe nanocrystals in the solution. After 30 min, the solution was stirred by means of a stirrer and irradiated with monochromatic excitation light (about 100-200 mW) at 612 nm, 586 nm, 566 nm, 556 nm and 545 nm for 30-90 min using an optical parametric amplifier laser.

Figure 11:
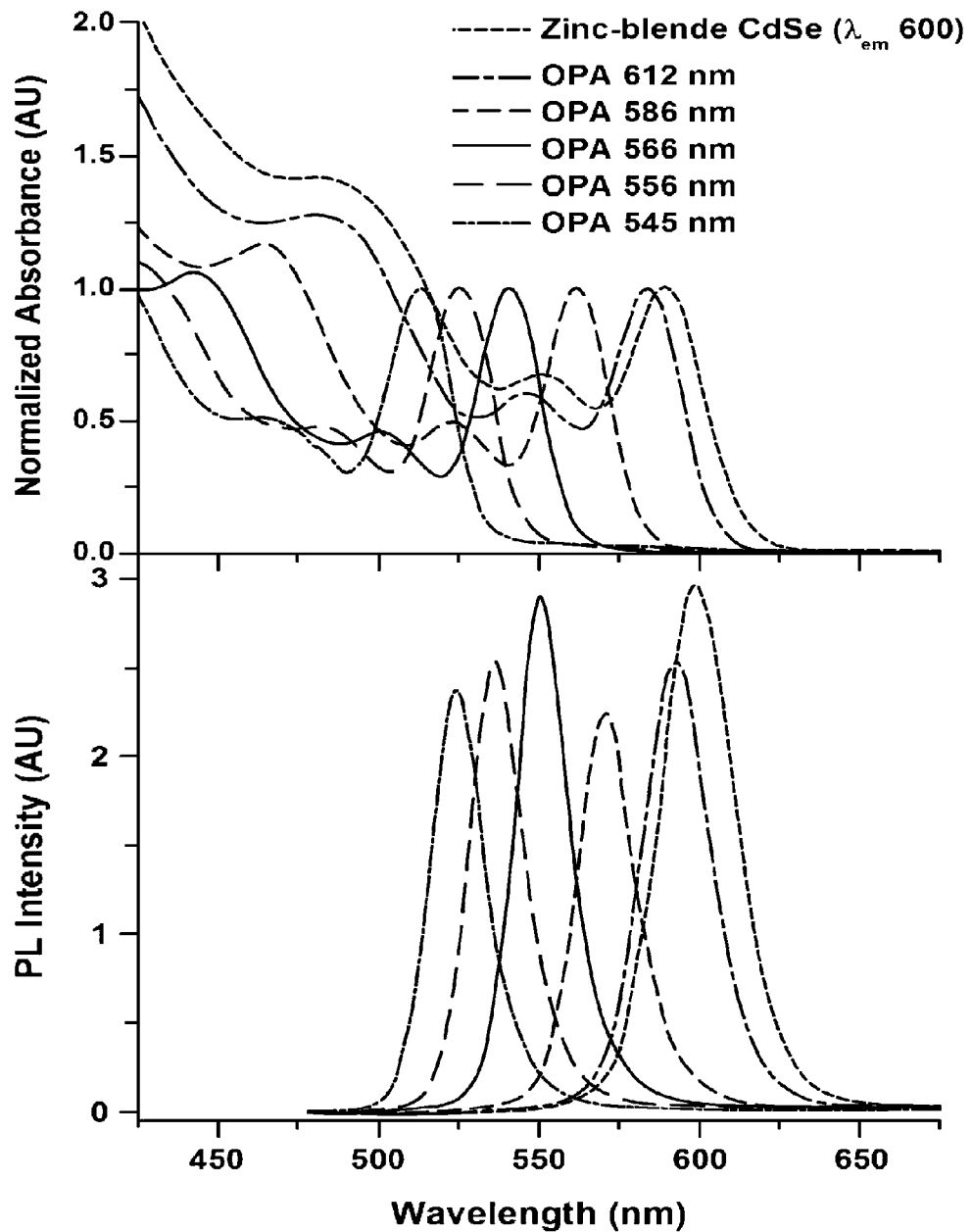
FIG. 11 is a graph showing the absorption spectrum of zinc blend CdSe nanocrystals which are size-selective photoetched by being irradiated with monochromatic excitation light at different wavelengths using the optical parametric amplifier laser in Example 18 and also showing the emission spectrum measured under conditions of luminescence improved using binary surface passivation after etching.

The solution was allowed to stand until the blue shift of absorption spectrum of the CdSe nanocrystals due to excitation light irradiation at respective wavelengths was not further observed, after which the reaction solution was added with about 50 μl of octylamine and about 10 μl of tributylphosphine, stored in dark room for 5 hours or longer and thus binary surface passivation (Kim et al., *J. Phys. Chem. C* 114:1539 (2010)) was performed, followed by measuring the absorption and emission spectrums. In this procedure, the recorded absorption and emission spectrums are shown in FIG. 11.

EXAMPLE 19

Synthesis of Highly Luminescent Color-Selective CdSe/ZnS Core/Shell Nanocrystals Using Size-Selective Photoetching of CdSe Nanocrystals Using Chloroform Solvent and Monochromatic Excitation Light CdSe nanocrystals were photoetched in the same manner as in Example 18, with the exception that excitation wavelengths of 460 nm, 475 nm, 516 nm and 554 nm were used. Then, the etched CdSe nanocrystals were precipitated in excess methanol and purified, after which, in order to grow a ZnS shell on the surface of the CdSe nanocrystals, they were dissolved in a octadecene-oleylamine-tributylphosphine mixture solution (volume=2 ml/2 ml/1 ml) and then heated to 100-150° C.

Subsequently, an about 0.1 M zinc acetate/oleylamine solution, a Zn precursor solution, and a 0.05 M bis(trimethylsilyl)sulfide/octadecene, an S precursor solution, were maintained at a ratio of 1:1 (Zn:S), and repetitively dropped onto the nanocrystals in a sequence of Zn, S, Zn, and S, so that a ZnS shell was grown in a layer-by-layer manner. As such, the dropping rate of the precursor solution was appropriately adjusted in the range of 0.1-1 ml/min. The ZnS shell was grown to total three monolayers, heating was stopped, and the resulting nanocrystals were purified with excess ethanol and then dissolved in chloroform and stored.

Figure 12:
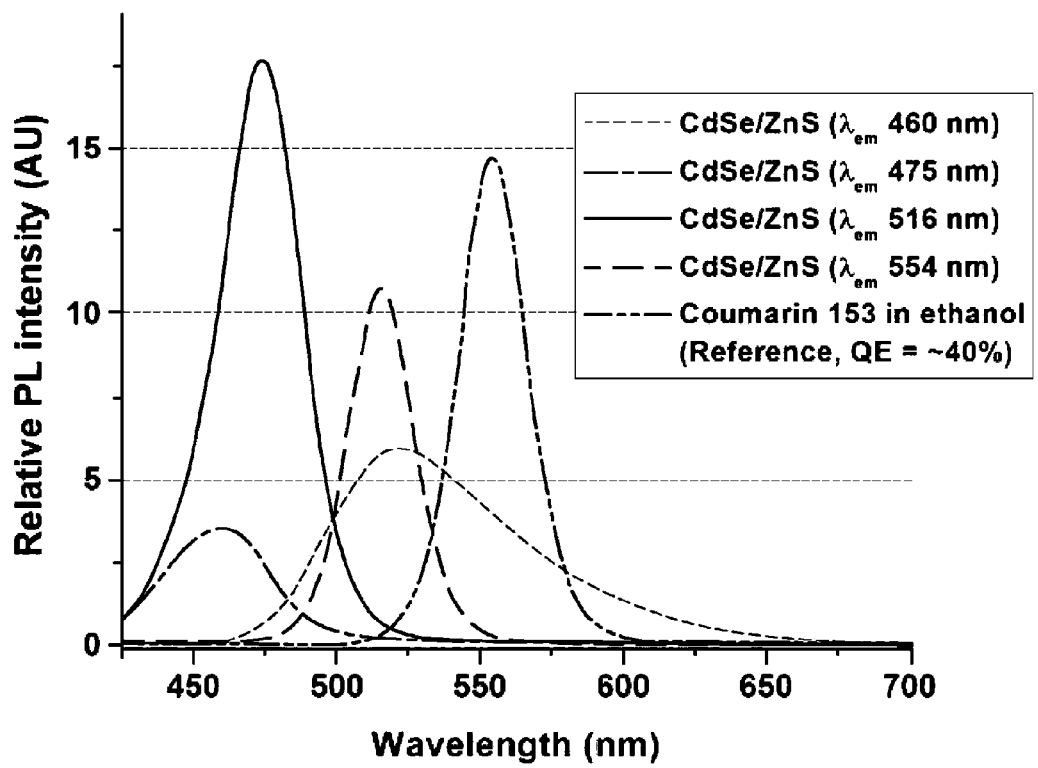
FIG. 12 is a fluorescence spectrum showing relative emission intensity of Coumarin 153 fluorescent dye (fluorescence yield: 38%) and four types of CdSe/ZnS core/shell nanocrystals having different emission wavelengths.

The absorption and emission spectra of the synthesized CdSe/ZnS core/shell nanocrystals were measured, and the fluorescence intensity thereof was compared with that of a Coumarin 153 (fluorescence yield: 38% (Jones I I et al., *J. Phys. Chem.* 89:294 (1985)) dye in ethanol, thus determining relative fluorescence yield. The fluorescence spectrum results of Coumarin 153 and various CdSe/ZnS nanocrystals at different fluorescence wavelengths are shown in FIG. 12.

Discussion for Results

FIG. 1A is a graph showing changes in the absorption spectrum with respect to time of zinc blend CdSe nanocrystals having different sizes (CdSe-520, CdSe-540, CdSe-570, CdSe-600, in which each number indicates the maximum emission wavelength) which are chemically etched by exposing a chloroform solution including the CdSe nanocrystals and tributylphosphine to high-purity oxygen at room temperature.

With reference to FIG. 1A, the absorption spectrums of four types of CdSe nanocrystals having different sizes were not remarkably changed before exposure to oxygen (specifically, no etching under an inert gas atmosphere such as Ar). However, after exposure to oxygen, the temperature of the solution was spontaneously increased by about 10-20° C. and also a blue shift began to take place and was observed to be about tens of nm within about 10 min. The rate and width of blue shift varies depending on the concentrations of tributylphosphine and nanocrystals, the exposure time to oxygen, etc.

FIG. 1B is of graphs showing the emission spectrum and time-resolved emission decay of zinc blend CdSe-570 nanocrystals before and after etching.

With reference to FIG. 1B, the emission quantum yield of the CdSe-570 nanocrystals was about 48% before etching and about 10% after etching, and the emission lifetime was shortened. This is considered to be because the surface state of the nanocrystals changed and became different from the one before etching by means of the chemical etching of CdSe-570 nanocrystals promoted by tertiary phosphine.

FIG. 1C is of high resolution transmission electron microscope images showing changes in average size of zinc blend CdSe-570 nanocrystals before and after etching. With reference to FIG. 1C, the CdSe-570 nanocrystals were etched very uniformly.

In this etching reaction, while tertiary phosphine is oxidized via a radical reaction in the chloroform solvent containing oxygen, phosphine oxide and chloride ions are formed thus etching the nanocrystals. (Chapman et al., *J. Am. Chem. Soc.* 57:416 (1935) and Buckler et al., *J. Am. Chem. Soc.* 84:3093 (1962))

FIG. 3A shows the X-ray photoelectron spectrum of the reaction product of Example 1, and FIG. 3B shows the mass spectrum of the reaction product of Example 1. With reference to FIG. 3A, the peak of chlorine (Cl) in addition to the Cd and Se peaks after chemical etching was clearly observed. With reference to FIG. 3B, the reaction product resulting from chemical etching was composed mainly of cadmium chloride ($CdCl_2$) and neutral selenium atom ($Se^0$).

As is apparent from the results of FIGS. 1A to 1C and 3A and 3B, the chemical etching process according to the present invention is based on a mechanism in which chloride ion ($Cl^-$) produced in the tributylphosphine-chloroform solution under oxidizing conditions by oxygen functions to desorb the Cd ions of the surface of CdSe nanocrystals in the form of cadmium chloride, and the selenium ions ($Se^{2-}$) of the surface of CdSe nanocrystals remaining after desorption of Cd ions are oxidized into neutral Se atoms. Because the halide ion is easy to form an ionic bond with most metals including groups II, III, or IV, the semiconductor nanocrystals can be very effectively etched according to the present invention.

FIG. 2A is of TEM images showing zinc blend CdSe nanospheres of Example 1 before and after chemical etching, and FIG. 2B is of TEM images showing wurtzite CdSe nanorods of Example 1 before and after chemical etching.

With reference to FIG. 2A, the zinc blend CdSe nanospheres having a diameter of about 4 nm became nanospheres having a diameter of about 3.6 nm after chemical etching. With reference to FIG. 2B, the wurtzite CdSe nanorods having a size of about 8.9 nm×3.7 nm (width×length) became shortened nanorods having a size of about 4.8 nm×3.6 nm after chemical etching.

The shape of the zinc blend CdSe nanospheres was maintained before and after etching, whereas the shape of the wurtzite CdSe nanorods was changed from long nanorods having an aspect ratio of about 2.4 into short nanorods having an aspect ratio of about 1.3 upon etching.

This means that the chemical etching process of semiconductor nanocrystals according to the present invention is an anisotropic facet-selective etching method in which the surface of semiconductor nanocrystals is etched at different rates depending on the type of facet thereof. When this etching method is used, it enables additional change in shape of semiconductor nanocrystals, and thus has high applicability.

FIG. 4A shows changes in the absorption spectrum of zinc blend CdSe nanocrystals which are etched by being dissolved in an oxidized tributylphosphine-chloroform solution in Example 6.

With reference to FIG. 4A, the CdSe nanocrystals synthesized via colloidal growth and purified were effectively etched even without additional supply of oxygen in the oxidized tributylphosphine-chloroform solution, and thus blue shift was observed at a very uniform rate of ones of nm/min on the absorption spectrum of the CdSe nanocrystals.

FIG. 4B shows changes in the absorption spectrum of zinc blend CdSe nanocrystals which are etched by being dissolved in the tributylphosphine-tetrachloromethane solution in Example 7.

With reference to FIG. 4B, the CdSe nanocrystals synthesized via colloidal growth and purified were very rapidly and effectively etched even without supplying oxygen in the tributylphosphine-tetrachloromethane solution, and a continuous blue shift was observed at a rate of at least ten nm/min in the absorption spectrum of the CdSe nanocrystals.

As is apparent from the results of FIGS. 4A and 4B, the chemical etching process according to the present invention is not an etching process by oxygen molecules but is an etching process by chloride ions produced via the reaction between tributylphosphine and methane chloride solvent. Whereas the chloroform solvent produces chloride ions in the course of oxidizing tributylphosphine, the tetrachloromethane solvent functions to provide tributylphosphine in the form of phosphonium chloride via nucleophilic SN2 reaction to thus produce chloride ions (Lorca, M. et al., *Synth. Commun.* 31:469 (2001)), thereby etching semiconductor nanocrystals.

FIG. 5 is a graph showing changes in the absorption spectrum of zinc blend CdSe nanocrystals which are etched by irradiating the chloroform solution including the CdSe nanocrystals and triphenylphosphine with UV light at a wavelength of 254 nm under an oxygen atmosphere in Example 8.

With reference to FIG. 5, because triphenylphosphine is not easily oxidized under normal conditions, even when the chloroform solution in which triphenylphosphine and CdSe nanocrystals were dissolved was exposed to oxygen, the etching reaction did not occur (curve a). However, in the case where triphenylphosphine is converted into an excited state by UV excitation light, it is very rapidly oxidized (Geoffroy et al., Inorg. Chem. 15:2310 (1976)). When the chloroform solution in which triphenylphosphine and CdSe nanocrystals were dissolved was exposed to UV excitation light, the etching reaction took place very actively (curve b). In this procedure, most of the CdSe nanocrystals were precipitated. Thereafter, as soon as excess propylamine was added to the chloroform solution in which triphenylphosphine and CdSe nanocrystals were dissolved, the CdSe nanocrystals were dissolved again (curve c). This means that the surface of CdSe nanocrystals is very vigorously etched via the etching reaction using triphenylphosphine under UV light.

As is apparent from the results of FIG. 5, while triphenylphosphine is rapidly oxidized by oxygen and UV light in the chloroform solvent, the CdSe nanocrystals are etched.

FIGS. 6A to 6D show absorption spectrums of group II-VI compound semiconductor nanocrystals such as CdS, CdTe and ZnSe and group IV-VI compound semiconductor nanocrystals such as PbS, which are chemically etched under tributylphosphine-chloroform conditions. Specifically, FIG. 6A is a graph showing changes in absorption spectrum of the CdS nanocrystals with respect to time in Example 9, FIG. 6B is a graph showing changes in absorption spectrum of the PbS nanocrystals with respect to time in Example 10, FIG. 6C is a graph showing changes in absorption spectrum of the CdTe nanocrystals with respect to time in Example 11, and FIG. 6D is a graph showing changes in the absorption spectrum of the ZnSe nanocrystals with respect to time in Example 12.

With reference to FIGS. 6A to 6D, the CdS, CdTe, ZnSe and PbS nanocrystals were effectively chemically etched under the same phosphine and halogenated solvent conditions as in the CdSe nanocrystals. Therefore, the method of etching the semiconductor nanocrystals according to the present invention can be very usefully and widely employed in etching semiconductor nanocrystals having various compositions.

FIGS. 7A and 7B show changes in the absorption spectrum of zinc blend CdSe nanocrystals which are etched by UV excitation light at 366 nm and 254 nm respectively in Example 13. FIGS. 7C and 7D show changes in the absorption spectrum of zinc blend CdSe nanocrystals which are etched by UV excitation light at 366 nm and 254 nm respectively in Comparative Example 1. FIGS. 7E and 7F show changes in the absorption spectrum of zinc blend CdSe nanocrystals which are etched by UV excitation light at 366 nm and 254 nm respectively in Comparative Example 2.

With reference to FIGS. 7A to 7F, in the case where the CdSe nanocrystals synthesized via colloidal growth and purified were dissolved along with a primary amine such as propylamine in a methane chloride solvent and then exposed to UV excitation light, a continuous blue shift was observed in the absorption spectrum of the CdSe nanocrystals. This means that photoetching for continuously reducing the particle size of the CdSe nanocrystals by excitation light occurred.

More specifically, with reference to FIGS. 7A and 7B, in the chloroform solvent, a continuous blue shift was able to occur at a rate of about 1 nm/min or less using the excitation light at 366 nm, and rapid blue shift was able to occur at a rate of ones to tens of nm/min using the excitation light at 254 nm. With reference to FIGS. 7C and 7D, in the dichloromethane solvent, photoetching of the CdSe nanocrystals was unable to easily take place using the excitation light at 366 nm, but a continuous blue shift was able to occur at a rate of 2-3 nm/min using the excitation light at 254 nm.

With reference to 7E and 7F, in the tetrachloromethane solvent, a blue shift was caused at a very rapid rate ranging from ten to less then twenty of nm/min using the excitation light at 366 nm and 254 nm. In particular, the photoetching reaction in the tetrachloromethane solvent took place while producing the precipitates including the CdSe nanocrystals. This means that the surface of the CdSe nanocrystals was difficult to stabilize by the ligand of primary amine such as propylamine attributed to the vigorous etching reaction.

In brief, the photoetching reaction of the CdSe nanocrystals depending on the type of methane chloride-series reaction solvent and the wavelength of excitation light can occur rapidly and vigorously in proportion to an increase in the electron affinity of the methane chloride-series solvent (i.e. tetrachloromethane>chloroform>dichloromethane) and also to the increase in the energy of excitation light (i.e. hv(254 nm)>hv(366 nm)).

FIG. 9A shows an X-ray photoelectron spectrum of the reaction product of Example 14. FIG. 9B shows a mass spectrum of the reaction product of Example 14. With reference to FIG. 9A, the peak of Cl in addition to the peaks of Cd and Se was observed after photoetching. Also, with reference to FIG. 9B, the photoetching reaction product was composed mainly of cadmium chloride ($CdCl_2$) and the neutral selenium atom ($Se^0$).

As is apparent from the results of FIGS. 7A to 7F and 9A and 9B, the photoetching reaction according to the present invention is dependent on a mechanism in which excited electrons of the CdSe nanocrystals to which UV excitation light is absorbed are transferred to the methane chloride solvent thus producing chloride ions ($Cl^-$), so that the Cd ions of surface of the CdSe nanocrystals are desorbed in the form of cadmium chloride by means of such chloride ions and the selenium ions ($Se^{2-}$) of the surface of the crystals remaining after desorption of the Cd ions are oxidized into neutral Se atoms by means of the holes remaining in the CdSe nanocrystals. The halogenated solvent molecules including methane chloride typically have high electron affinity, and thus halide ions or radicals are easily generated via electron transfer (Bortolus et al., Polym. Photochem. 4:45 (1984)), and halide ions may easily form an ionic bond with most metals including groups II, III, and IV, whereby the semiconductor nanocrystals can be very effectively etched according to the present invention.

For this reason, the method of photoetching semiconductor nanocrystals according to the present invention has a quite different reaction mechanism and is regarded as novel and highly valuable, compared to a conventional aqueous photoetching method using oxygen including oxidizing the chalcogen element of the surface of group II-VI or IV-VI compound semiconductor nanocrystals thus forming a chalcogen oxide ($SO_4^{2-}$, $SeO_2$, etc.) to thereby etch semiconductor nanocrystals (U.S. Ser. No. 07/006,5665 and EP 1 491 502). In particular, this method can be directly applied to most of semiconductor nanocrystals synthesized in a non-aqueous organic solvent, and is more rapid than photoetching using oxygen, and enables the photoetching rate and other aspects to be freely changed depending on the type of halogenated solvent. Furthermore, this method is advantageous because various organic ligands used in the synthesis of semiconductor nanocrystals, such as a primary amine and a tertiary phosphine, may be used in the etching reaction, compared to conventional photoetching methods.

FIG. 8A is of TEM images showing zinc blend CdSe nanospheres before and after photoetching in Example 13, and FIG. 8B is of TEM images showing wurtzite CdSe nanorods before and after photoetching in Example 13.

With reference to FIGS. 8A and 8B, the zinc blend CdSe nanospheres having a diameter of about 4 nm became nanospheres having a diameter of about 3.2 nm after photoetching, and the wurtzite CdSe nanorods having a size of about 8.9 nm×3.7 nm (width×length) became nanorods having a size of about 7.4 nm×3.1 nm after photoetching.

In both cases, the shape of the nanocrystals was maintained before and after photoetching. In particular, in the case of wurtzite CdSe nanorods, isotropic etching in which an aspect ratio (Asp) is similarly maintained at about 2.4 was observed. Torimoto reported anisotropic etching in which CdS nanorods having a size of about 14 nm×3.5 nm (Asp=about 4) were converted into smaller CdS nanorods having a size of about 4.2 nm×2.3 nm (Asp=about 1.8) by an aqueous photoetching reaction using oxygen (Torimoto et al., *J. Nanosci. Nanotechno.* 9:506 (2009)). This means that the photoetching reaction of semiconductor nanocrystals according to the present invention may induce the change in shape of nanocrystals and is thus differentiated from conventional photoetching using oxygen. In particular, the photoetching reaction of semiconductor nanocrystals according to the present invention allows the nanocrystals to be etched while maintaining the complicated shape thereof and is thus regarded as very highly valuable.

FIGS. 10A to 10C show the absorption spectrums of group II-VI compound semiconductor nanocrystals such as CdS and CdTe and group IV-VI compound semiconductor nanocrystals such as PbS, which are photoetched under conditions of a chloroform solvent. Specifically, FIG. 10A is a graph showing changes in the absorption spectrum of the CdS nanocrystals with respect to time in Example 15, FIG. 10B is a graph showing changes in absorption spectrum of the CdTe nanocrystals with respect to time in Example 16, and FIG. 10C is a graph showing changes in the absorption spectrum of the PbS nanocrystals with respect to time in Example 17.

With reference to FIGS. 10A to 10C, the CdS and PbS nanocrystals were photoetched under the conditions of a primary amine additive such as octylamine similarly to in the CdSe nanocrystals, and the CdTe nanocrystals were effectively photoetched under conditions of a primary amine and a tertiary phosphine mixed together. This is considered important because the photoetching reaction can be additionally controlled by the use of an organic ligand additive, in addition to the solvent. Hence, the method of photoetching semiconductor nanocrystals according to the present invention is advantageous because semiconductor nanocrystals having various compositions can be effectively etched without complicated steps by using the halogenated solvent and some organic ligand additives conventionally used for the synthesis of nanocrystals.

FIG. 11 is a graph showing the absorption spectrum of zinc blend CdSe nanocrystals which are size-selectively photoetched by being irradiated with monochromatic excitation light at different wavelengths using an optical parametric amplifier laser in Example 18 and also showing emission spectrum measured under luminescence improved using binary surface passivation after etching.

FIG. 11 shows the size-selective photoetching reaction in which only the CdSe nanocrystals having a size able to absorb monochromatic excitation light under conditions of a chloroform solvent/octylamine additive are selectively etched. In this procedure, the wavelength of the laser was adjusted, thus precisely controlling the absorption and emission wavelengths of the etched CdSe nanocrystals to the level of nm, and the size of the CdSe nanocrystals was maintained uniform and full width at half maximum of the emission wavelength was thus reduced from about 27 nm before etching to about 20 nm after etching.

Furthermore, the binary surface passivation for improving the luminescence of the CdSe nanocrystals was applied after etching, so that the emission efficiency of the nanocrystals was increased to about 30% or more. Thereby, highly luminescent semiconductor nanocrystals having a uniform size with absorption/emission wavelengths controlled to the level of nm by means of the photoetching method using a halogenated solvent and monochromatic excitation light can be manufactured.

FIG. 12 shows a fluorescence spectrum showing the relative emission intensity of a Coumarin 153 fluorescent dye (fluorescence yield: 38%) and four types of CdSe/ZnS core/shell nanocrystals having different emission wavelengths.

With reference to FIG. 12, the emission wavelength of the core of the CdSe nanocrystals was precisely controlled by size-selective photoetching and the ZnS shell was then clad thereon, thereby easily synthesizing highly luminescent CdSe/ZnS core/shell nanocrystals (emission yield: 30-80%) having a desired emission color. In particular, the size-selective photoetching method enables the manufacture of CdSe nanocrystals (full width at half maximum: about 20 nm) having a very uniform size distribution showing fluorescence at 400 nm, thus making it possible to reproducibly synthesize highly luminescent CdSe/ZnS nanocrystals having blue fluorescence which were difficult to synthesize using a conventional colloidal growth method.

As described hereinbefore, the present invention provides a method of etching semiconductor nanocrystals. According to an embodiment of the present invention, halide ions which are a reaction product of phosphine and halogenated solvent can induce the chemical etching for removing metal ions from the surface of semiconductor nanocrystals, thus rapidly and reproducibly controlling the shape and properties of the semiconductor nanocrystals.

Also according to an embodiment of the present invention, the average size of semiconductor nanocrystals can be reduced at a desired rate in the range from ones of min/nm to tens of min/nm, and the absorption/emission wavelength can be precisely controlled to the level of nm.

Also according to an embodiment of the present invention, anisotropic facet-selective etching able to reduce the aspect ratio of anisotropic nanocrystals such as semiconductor nanorods is possible, thus enabling additional control of the shape and properties of the nanocrystals.

According to another embodiment of the present invention, halide ions which are a generated from halogenated solvent as a result of the electron transfer from the photoexcitied semiconductor nanocrystals to the halogenated solvent molecules can induce the photoetching for removing metal ions from the surface of semiconductor nanocrystals, thus rapidly and reproducibly controlling the shape and properties of the semiconductor nanocrystals.

According to another embodiment of the present invention, the average size of semiconductor nanocrystals can be reduced at a desired rate in the range from ones of min/nm to tens of min/nm, and the absorption/emission wavelength can be precisely controlled to the level of nm.

Also according to another embodiment of the present invention, one or more selected from among a primary amine and a tertiary phosphine can be added so that the emission efficiency of fluorescence of semiconductor nanocrystals can be reproducibly increased to the level of 30% or more in the course of photoetching.

Also according to another embodiment of the present invention, semiconductor nanocrystals having a uniform size distribution with a full width at half maximum of 20 nm or less in the visible light range using monochromatic light can be manufactured, thus enabling precise size-selective photoetching.

Furthermore, according to another embodiment of the present invention, isotropic etching in which the total size of anisotropic nanocrystals such as nanorods can be reduced while the aspect ratio thereof is not greatly changed is possible, thereby etching the nanocrystals while maintaining the complicated shape thereof, resulting in increased applicability.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims Accordingly, such modifications, additions and substitutions should also be understood as falling within the scope of the present invention.

What is claimed is:

1. A method of etching semiconductor nanocrystals, comprising:
   (1) preparing a first solution by dissolving a phosphine in a halogenated solvent, wherein the first solution includes halide ions as a reaction product of the phosphine and the halogenated solvent; and
   (2) combining semiconductor nanocrystals with the first solution, wherein the halide ions induce chemical etching of the semiconductor nanocrystals by removing metal ions from the surface of the semiconductor nanocrystals.

2. The method as set forth in claim 1, further comprising (a) exposing the first solution to oxygen, between steps (1) and (2).

3. The method as set forth in claim 1, further comprising (3) exposing the first solution combined with the semiconductor nanocrystals to oxygen, thus inducing etching of the semiconductor nanocrystals.

4. The method as set forth in claim 1, further comprising (3) exposing the first solution combined with the semiconductor nanocrystals to oxygen and irradiating the first solution combined with the semiconductor nanocrystals with UV excitation light, thus inducing etching of the semiconductor nanocrystals.

5. The method as set forth in claim 1, wherein the semiconductor nanocrystals comprise one or more group II-VI, III-V and IV-VI compound.

6. The method as set forth in claim 5, wherein the semiconductor nanocrystals comprise one or more binary compounds selected from the group consisting of ZnO, ZnS, ZnSe, ZnTe, CdO, CdS, CdSe, CdTe, HgS, HgSe, HgTe, GaN, GaP, GaAs, InN, InP, InAs, PbS, PbSe, and PbTe; or one or more trinary compounds selected from the group consisting of CdSeS, CdSeTe, CdSTe, ZnSeS, ZnSeTe, ZnSTe, CdZnS, CdZnSe, CdZnTe, GaNP, GaNAs, GaNSb, GaPAs, GaPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, SnSeS, SnSeTe, SnSTe, PbSeS, PbSeTe, PbSTe, and SnPbS; or one or more quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, nPbSSe, SnPbSeTe, and SnPbSTe.

7. The method as set forth in claim 1, wherein the semiconductor nanocrystals are a heterostructure comprising one or more compositions.

8. The method as set forth in claim 7, wherein the heterostructure is a junction structure, a core-shell structure, a superlattice structure or a combination thereof.

9. The method as set forth in claim 1, wherein the halogenated solvent is selected from the group consisting of $C_1$-$C_{18}$ alkane, $C_2$-$C_{18}$ alkene, toluene, phenol and benzene, each of which is substituted with one or more halogens.

10. The method as set forth in claim 9, wherein the halogenated solvent is selected from the group consisting of dichloromethane ($CH_2Cl_2$), chloroform ($CHCl_3$), tetrachloromethane ($CCl_4$), dibromomethane ($CH_2Br_2$), bromoform ($CHBr_3$), tetrabromomethane ($CBr_4$), diiodomethane ($CH_2I_2$), iodoform ($CHI_3$), tetraiodomethane ($CI_4$) and tetrachloroethylene ($C_2Cl_4$).

11. The method as set forth in claim 1, wherein the phosphine is a tertiary phosphine having a carbon branch, and the carbon branch of the tertiary phosphine is selected from the group consisting of $C_3$-$C_{18}$ alkane, $C_3$-$C_{18}$ alkene, $C_3$-$C_{18}$ saturated aliphatic amine, $C_3$-$C_{18}$ unsaturated aliphatic amine, $C_3$-$C_{18}$ saturated aliphatic alcohol, $C_3$-$C_{18}$ unsaturated aliphatic alcohol, $C_3$-$C_{18}$ saturated fatty acid, $C_3$-$C_{18}$ unsaturated fatty acid, $C_3$-$C_{18}$ saturated aliphatic thiol, $C_3$-$C_{18}$ unsaturated aliphatic thiol, phenyl ($C_6H_6$), and benzyl ($C_6H_6CH_2$).

12. The method as set forth in claim 11, wherein the tertiary phosphine is a tertiary phosphine oligomer or a tertiary phosphine polymer.

13. The method as set forth in claim 1, wherein an etching rate of the semiconductor nanocrystals is controlled by one or more conditions selected from the group consisting of a concentration of semiconductor nanocrystals, a concentration of phosphine, a type of phosphine, a type of halogenated solvent, and oxidizing conditions.

14. A method of etching semiconductor nanocrystals, comprising:
   (1) preparing a first solution by dissolving a phosphine and a primary amine in a halogenated solvent;
   (2) combining semiconductor nanocrystals with the first solution; and
   (3) irradiating the first solution combined with semiconductor nanocrystals with exciting light having a wavelength capable of being absorbed by the semiconductor nanocrystals to provide photoexcited semiconductor nanocrystals, thus inducing etching of the semiconductor nanocrystals,
   wherein the halogenated solvent receives electrons from the photoexcited semiconductor nanocrystals to produce halide ions and induce a photoetching reaction by removing metal ions along with the primary amine from the surface of semiconductor nanocrystals.

15. The method as set forth in claim 14, wherein the primary amine is a $C_1$-$C_{18}$ saturated aliphatic amine or a $C_1$-$C_{18}$ unsaturated aliphatic amine.

16. The method as set forth in claim 14, wherein the primary amine is one or more amine selected from the group consisting of $C_1$-$C_{18}$ alkane having a plurality of primary amine functional groups, $C_2$-$C_{18}$ alkene having a plurality of primary amine functional groups, an oligomer having a primary amine functional group, and a polymer having a primary amine functional group.

17. The method as set forth in claim 14, wherein the wavelength of the excitation light is shorter than an absorption edge of the semiconductor nanocrystals.

18. The method as set forth in claim 17, wherein an etching rate of the semiconductor nanocrystals is controlled by one or more conditions selected from the group consisting of a concentration of the semiconductor nanocrystals, a concentration of the primary amine, a concentration of the phosphine, a wavelength of the excitation light, and an irradiation power of the excitation light.

19. The method as set forth in claim 14, wherein the semiconductor nanocrystals comprise one or more group II-VI, III-V or IV-VI compounds.

20. The method as set forth in claim 14, wherein the semiconductor nanocrystals are a heterostructure comprising one or more compositions.

21. The method as set forth in claim 14, wherein the halogenated solvent is selected from the group consisting of $C_1$-$C_{18}$ alkane, $C_2$-$C_{18}$ alkene, toluene, phenol and benzene, each of which is substituted with one or more halogens.

22. The method as set forth in claim 14, wherein the phosphine is a tertiary phosphine having a carbon branch, and the carbon branch of the tertiary phosphine is selected from the group consisting of $C_3$-$C_{18}$ alkane, $C_3$-$C_{18}$ alkene, $C_3$-$C_{18}$ saturated aliphatic amine, $C_3$-$C_{18}$ unsaturated aliphatic amine, $C_3$-$C_{18}$ saturated aliphatic alcohol, $C_3$-$C_{18}$ unsaturated aliphatic alcohol, $C_3$-$C_{18}$ saturated fatty acid, $C_3$-$C_{18}$ unsaturated fatty acid, $C_3$-$C_{18}$ saturated aliphatic thiol, $C_3$-$C_{18}$ unsaturated aliphatic thiol, phenyl ($C_6H_6$), and benzyl ($C_6H_6CH_2$).

* * * * *